(12) United States Patent
Hayashi et al.

(10) Patent No.: US 9,732,435 B2
(45) Date of Patent: Aug. 15, 2017

(54) GROUP 13 NITRIDE CRYSTAL AND GROUP 13 NITRIDE CRYSTAL SUBSTRATE

(75) Inventors: Masahiro Hayashi, Miyagi (JP); Seiji Sarayama, Miyagi (JP); Takashi Satoh, Miyagi (JP); Hiroshi Nambu, Kanagawa (JP); Chiharu Kimura, Miyagi (JP); Naoya Miyoshi, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 860 days.

(21) Appl. No.: 13/609,077

(22) Filed: Sep. 10, 2012

(65) Prior Publication Data

US 2013/0064749 A1   Mar. 14, 2013

(30) Foreign Application Priority Data

Sep. 14, 2011   (JP) ................................. 2011-201216

(51) Int. Cl.
  *C30B 29/40*  (2006.01)
  *C30B 7/10*  (2006.01)
  (Continued)

(52) U.S. Cl.
  CPC .............. *C30B 7/105* (2013.01); *C30B 9/00* (2013.01); *C30B 29/403* (2013.01); *C30B 29/406* (2013.01); *C30B 29/607* (2013.01)

(58) Field of Classification Search
  CPC ........ C30B 9/00; C30B 29/403; C30B 29/406
  See application file for complete search history.

(56) References Cited

U.S. PATENT DOCUMENTS

2003/0164138 A1   9/2003   Sarayama et al.
2004/0134413 A1   7/2004   Iwata et al.
(Continued)

FOREIGN PATENT DOCUMENTS

JP   2005-45047   2/2006
JP   2008-94704   4/2008
(Continued)

OTHER PUBLICATIONS

Smalc-Koziorowska et al. ("Structural defects in GaN crystals grown by HVPE on needle-shaped GaN seeds obtained under high N2 pressure," Journal of Crystal Growth 311(5), pp. 1407-1410, Feb. 2009).*

(Continued)

*Primary Examiner* — Melvin C Mayes
*Assistant Examiner* — James Corno
(74) *Attorney, Agent, or Firm* — Cooper & Dunham LLP

(57) ABSTRACT

A group 13 nitride crystal having a hexagonal crystal structure and containing at least a nitrogen atom and at least a metal atom selected from a group consisting of B, Al, Ga, In, and Tl. The group 13 nitride crystal includes a first region disposed on an inner side in a cross section intersecting c-axis, a third region disposed on an outermost side in the cross section and having a crystal property different from that of the first region, and a second region disposed at least partially between the first region and the third region in the cross section, the second region being a transition region of a crystal growth and having a crystal property different from that of the first region and that of the third region.

10 Claims, 14 Drawing Sheets

(51) Int. Cl.
*C30B 9/00* (2006.01)
*C30B 29/60* (2006.01)

(56) References Cited

U.S. PATENT DOCUMENTS

| | | |
|---|---|---|
| 2004/0226503 A1 | 11/2004 | Iwata et al. |
| 2006/0006395 A1 | 1/2006 | Kobayashi et al. |
| 2007/0034143 A1 | 2/2007 | Sarayama et al. |
| 2007/0084399 A1 | 4/2007 | Sarayama et al. |
| 2007/0128746 A1 | 6/2007 | Iwata et al. |
| 2007/0194408 A1 | 8/2007 | Iwata et al. |
| 2007/0215034 A1 | 9/2007 | Iwata et al. |
| 2007/0266928 A1 | 11/2007 | Iwata et al. |
| 2008/0081015 A1 | 4/2008 | Sarayama et al. |
| 2008/0216737 A1 | 9/2008 | Sarayama et al. |
| 2008/0220346 A1 | 9/2008 | Sarayama et al. |
| 2008/0264331 A1 | 10/2008 | Iwata et al. |
| 2009/0249997 A1 | 10/2009 | Sarayama et al. |
| 2010/0229787 A1 | 9/2010 | Sarayama et al. |
| 2011/0012235 A1 | 1/2011 | Iwata et al. |
| 2011/0253034 A1 | 10/2011 | Iwata et al. |
| 2012/0003446 A1 | 1/2012 | Satoh et al. |
| 2012/0085279 A1 | 4/2012 | Sarayama et al. |
| 2013/0011677 A1* | 1/2013 | Nambu ............ C30B 9/10 428/389 |

FOREIGN PATENT DOCUMENTS

| | | | |
|---|---|---|---|
| JP | 2008-110910 | 5/2008 | |
| JP | 2009-126771 | 6/2009 | |
| JP | 2010-280562 | 12/2010 | |
| JP | WO 2011115072 A1 * | 9/2011 | ............ C30B 9/10 |
| JP | 2011-213579 | 10/2011 | |

OTHER PUBLICATIONS

Slack et al. ("Some effects of oxygen impurities on AlN and GaN," Journal of Crystal Growth 246(3-4), pp. 287-298, Dec. 2002).*

Liang et al. ("Improved crystal quality of GaN film with the in-plane lattice-matched In0.17Al0.83N interlayer grown on sapphire substrate using pulsed metal organic chemical vapor deposition," Chinese Physics B 23(6), pp. 067103-1-6, Apr. 2014).*

Singh et al. ("Intensity dependence of photoluminescence in GaN thin films," Applied Physics Letters 64(3), pp. 336-338, Jan. 1994).*

Hisanori Yamane, at al., "Preparation of GaN Single Crystals Using a Na Flux," Chemistry of Materials vol. 9, 1997, pp. 413-416.

* cited by examiner

GROUP 13 NITRIDE CRYSTAL AND GROUP 13 NITRIDE CRYSTAL SUBSTRATE

CROSS-REFERENCE TO RELATED APPLICATIONS

The present application claims priority to and incorporates by reference the entire contents of Japanese Patent Application No. 2011-201216 filed in Japan on Sep. 14, 2011.

BACKGROUND OF THE INVENTION

1. Field of the Invention

The present invention relates to a group 13 nitride crystal and a group 13 nitride crystal substrate.

2. Description of the Related Art

Semiconductor materials based on gallium nitride (GaN) are used for blue color LED (light-emitting diode) or white color LED, and a semiconductor device such as semiconductor laser (also called "LD: Laser Diode"). The white color LED is used for illumination purpose or back lighting of cell phones, LC (Liquid Crystal) display or the like. The blue color LED is used for traffic lights or other illumination purpose and so on. On the other hand, blue-violet semiconductor laser is used as light sources of Btu-ray discs. Presently, most of semiconductor devices based on GaN used as light sources of UV or violet-blue-green color are manufactured by using MO-CVD (Metalorganic Chemical Vapor Deposition) method or MBE (Molecular Beam Epitaxy) method to grow crystal on sapphire or SiC substrate.

There are problems in a case that sapphire or SiC is used as substrate. Crystal defects increases because of the significant difference of thermal expansion coefficient or lattice constant between the substrate and the group 13 nitride. Such a defect affects device properties. For example, it becomes harder to elongate the lifetime of emitting device. And, the operating power may increase. In order to address these problems, it is the most preferable way to use a gallium nitride substrate which is made of the same material as crystal to be grown on the substrate.

Presently, free-standing GaN substrates are manufactured in such a manner that a thick gallium nitride crystal is grown on a hetero-substrate such as sapphire substrate or GaAs substrate by HVPE (Hydride Vapor Phase Epitaxy) with employing ELO (Epitaxial Lateral Overgrowth) which is a method to reduce the dislocation density, and then the thick film of gallium nitride is separated from the hetero-substrate. The gallium nitride substrate manufactured as such has a dislocation density reduced to the order of $10^6$ $cm^{-2}$, and allows a size up to 2 inches in practical use mainly for laser device purpose. Recently, there is a further need for much larger diameter of substrate up to 4 inches or 6 inches for electronic devices, or cost saving of white color LEDs.

Warpage or cracks which may be induced by the difference of the thermal expansion coefficient or the lattice constant between the hetero-substrate and the gallium nitride hinders to enlarge the diameter of substrate. The aforementioned dislocation density still remains. There is also a problem of high manufacturing cost in processes of separating one thick film of gallium nitride from one hetero-substrate, and polishing it to form the gallium nitride substrate.

On the other hand, as one of liquid phase methods to realize the gallium nitride substrate, many efforts have been made for developing a flux method in which the gallium nitride crystal is formed by dissolving the nitrogen from a gaseous phase into a molten mixture of group 13 metal and alkali metal.

In the flux method, a molten mixture containing the alkali metal such as sodium (Na) and potassium (K) and the group 13 metal such as gallium (Ga) is heated to about 600 to 900 degrees Celsius under an atmosphere where the nitrogen pressure is 10 MPa or less. Thus, the nitrogen is dissolved from the gaseous phase and reacts with the group 13 metal in the molten mixture to form the group 13 nitride crystal. The flux method allows a crystal growth with a lower temperature and lower pressure in comparison with other liquid phase methods. The crystal formed by the flux method has a low dislocation density advantageously lower than $10^6$ $cm^{-2}$.

There is a report that gallium nitride crystal is formed under conditions that sodium azide ($NaN_3$) and metal Ga which are used as source materials are put and sealed in a reactor vessel made of stainless material (as for sizes inside of the vessel, inner diameter is 7.5 mm, length is 100 mm) under a nitrogen atmosphere, and the reactor vessel is retained at 600 to 800 degrees Celsius for 24 to 100 hours (Chemistry of Materials Vol. 9 (1997) 413-416).

Japanese Patent Application Laid-open No. 2008-94704 discloses a method of manufacturing a column-like crystal of gallium nitride by using a needle-like crystal of aluminum nitride (AlN) as seed crystal in order to provide a large crystal of gallium nitride. Japanese Patent Application Laid-open No. 2006-045047 discloses a method of manufacturing a needle-like crystal of aluminum nitride which becomes a seed crystal. Japanese Patent Application Laid-open No. 2009-126771 discloses a seed crystal of which a yellow emission effect is observed, and a gallium nitride crystal which is formed on the seed crystal and has a crystal layer of which a yellow emission effect is not observed.

In a case that gallium nitride crystal is grown from aluminum nitride as seed crystal, however, the difference of lattice constant between aluminum nitride and gallium nitride may cause dislocations due to the lattice mismatch. Since thermal expansion coefficient is also different between aluminum nitride and gallium nitride, thermal stress may cause new dislocations or even cracks, in the course of cooling from a crystal growth temperature to a room temperature.

Therefore, it is preferable to use gallium nitride crystal as seed crystal which has the same lattice constant or the same thermal expansion coefficient with the target crystal, in order to grow a high quality gallium nitride crystal with low dislocation density. However, it is difficult to grow a needle-like crystal of gallium nitride by the method disclosed in Japanese Patent Application Laid-open No. 2006-045047.

SUMMARY OF THE INVENTION

It is an object of the present invention to at least partially solve the problems in the conventional technology.

A group 13 nitride crystal having a hexagonal crystal structure and containing at least a nitrogen atom and at least a metal atom selected from a group consisting of B, Al, Ga, In, and Tl. The group 13 nitride crystal includes a first region disposed on an inner side in a cross section intersecting c-axis, a third region disposed on an outermost side in the cross section and having a crystal property different from that of the first region, and a second region disposed at least partially between the first region and the third region in the cross section. The second region is a transition region of a crystal growth and has a crystal property different from that of the first region and that of the third region.

A group 13 nitride crystal substrate includes at least a part of the aforementioned group 13 nitride crystal.

DETAILED DESCRIPTION OF THE PREFERRED EMBODIMENTS

Figure 1:
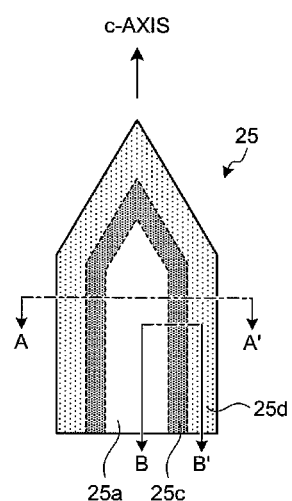
FIG. 1 is a view showing an exemplary cross section of a group 13 nitride crystal parallel to its c-axis and a-axis.

Now an explanation will be made on a group 13 nitride crystal and a group 13 nitride crystal substrate with reference to the accompanying drawings. The accompanying drawings herein only schematically show shapes, sizes and arrangements of constituents, elements or components to an extent necessary for a clear understanding of the present invention. However, these drawings shall not be considered any limitation to the present invention. Identical reference numerals are given to the same or corresponding constituents, elements or components among the plurality of drawings, while the redundant explanation may be omitted as appropriate.

The group 13 nitride crystal according to the present invention has a hexagonal crystal structure and contains at least a nitrogen atom and at least a metal atom selected from a group consisting of B (Boron), Al (Aluminum), Ga (Gallium), In (Indium), and Tl (Thallium). The group 13 nitride crystal includes a first region disposed on an inner side in a cross section intersecting c-axis, a third region disposed on an outermost side in the cross section and having a crystal property different from that of the first region, and a second region disposed at least partially between the first region and the third region in the cross section. The second region is a transition region of a crystal growth and has a crystal property different from that of the first region and that of the third region.

In the group 13 nitride crystal of the present embodiment, the second region 25c, which is the transition region of the crystal growth, is disposed at least partially between the inner first region 25a and the outermost third region 25d in the cross section intersecting the c-axis of the group 13 nitride crystal. Therefore, it is considered that the group 13 nitride crystal 25 provided in the present embodiment can be a high quality group 13 nitride crystal.

More specifically, the second region is a region formed at the initial stage of crystal growth from a seed crystal being the first region when a group 13 nitride crystal is manufactured. The details of a method of manufacturing the group 13 nitride crystal will be described later. At the initial stage of crystal growth, it is considered to be difficult to form a crystal having properties identical to those of the seed crystal (first region) immediately after the start of the crystal growth because of growth conditions, for example, the time until the crystal growth atmosphere becomes stable and the surface state of the seed crystal. In addition, it is considered that impurities may be trapped differently for different crystal growth directions. Even when a crystal having properties different from those of the seed crystal (first region) is intentionally grown, a region having dislocations concentrated therein and including a large amount of impurities may be formed at the initial stage of crystal growth. The second region is considered to be a region formed at the initial stage of crystal growth and having dislocations concentrated therein or including a large amount of impurities, because of the above reasons. Specifically, the second region is considered to be a region containing a larger number of dislocations or a larger amount of impurities than the first and third regions.

The third region is a region formed on the first region directly or through the second region during production of the group 13 nitride crystal described later. Therefore, the third region is considered to be a high crystal quality region having a lower dislocation density than the second region or including a lesser amount of impurities. This may be because the second region functions as a transition or buffer region during crystal growth. As described above, a third region having high crystal quality can be formed through the second region. Therefore, this may allow a high quality group 13 nitride crystal to be provided.

The "high quality group 13 nitride crystal" means that the number of defects such as dislocations is smaller in the outermost region in a cross section intersecting the c-axis than in an inner region. The outermost region is a partial region continuously extending inwardly from the outer edges of the cross section intersecting the c-axis of the group 13 nitride crystal and corresponds to the third region. The inner region is a region used as the seed crystal in the cross section. More specifically, the inner region corresponds to the first region and a fourth region, which will be described later.

A detailed description will now be given.
—Group 13 Nitride Crystal—

The group 13 nitride crystal according to the present embodiment is a group 13 nitride crystal having a hexagonal crystal structure and containing at least a nitrogen atom and at least a metal atom selected from the group consisting of B, Al, Ga, In, and Tl. The group 13 nitride crystal according to the present embodiment contains, as the metal atom, preferably at least one of Ga and Al, and more preferably at least Ga.

In the present embodiment, the group 13 nitride crystal has a plurality of regions having different crystal properties. Although the details of the regions having different crystal properties will be described later, these regions can be broadly classified into a group 13 nitride crystal 25a used as the seed crystal, a group 13 nitride crystal 25d grown from the seed crystal, and a transition region 25c located at the boundary between the seed crystal and the group 13 nitride crystal 25d grown from the seed crystal, as shown in FIG. 1. In the present embodiment, each of these regions (25a, 25c, and 25d) may comprise a plurality of regions, and another region may be present.

Figure 2:
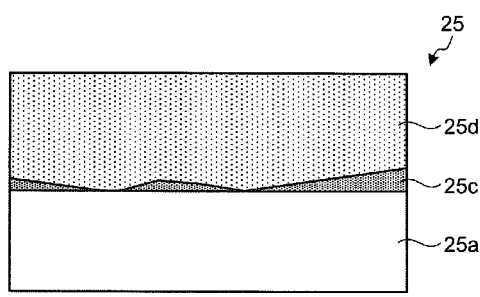
FIG. 2 is a view showing an exemplary cross section of the group 13 nitride crystal parallel to its c-axis and a-axis.
Figure 3:
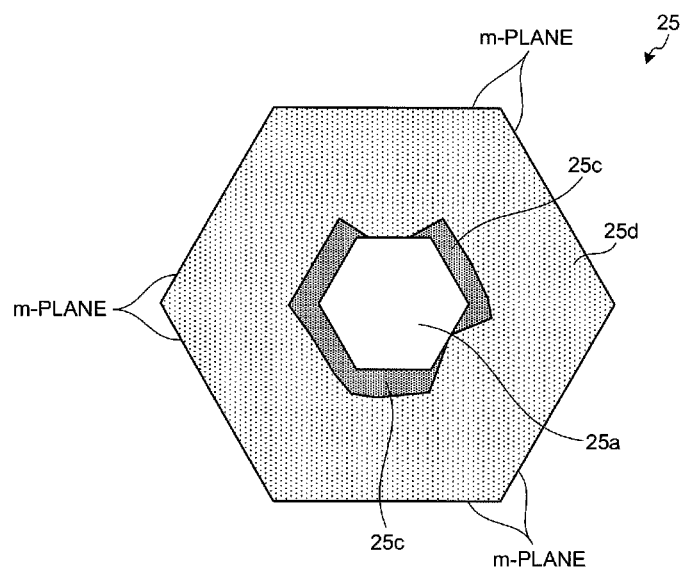
FIG. 3 is a view showing an exemplary c-plane cross section of the group 13 nitride crystal.

FIGS. 1 to 3 show an example of the group 13 nitride crystal of the present embodiment. More specifically, FIG. 1 is a schematic cross section illustrating an example of the structure of the group 13 nitride crystal of the present embodiment. FIG. 1 is a cross section parallel to the c-axis and an a-axis of the group 13 nitride crystal 25 having a hexagonal crystal structure. FIG. 2 is a cross section parallel to the c-axis and an a-axis of the group 13 nitride crystal 25 and is a B-B' cross section in FIG. 1. FIG. 3 is a c-plane cross section (a cross section parallel to the c-plane) of the group 13 nitride crystal 25 and is an A-A' cross section in FIG. 1.

As shown in FIG. 3, in the group 13 nitride crystal 25, the cross section perpendicular to the c-axis (the c-plane) has a hexagonal shape. In the present embodiment, the hexagonal shape is used to include a regular hexagonal shape and hexagonal shapes other than the regular hexagonal shape. The side faces of the group 13 nitride crystal 25 that correspond to the sides of the hexagon are composed mainly of m-planes (see reference numeral 22A in FIG. 1) of the hexagonal crystal structure.

The group 13 nitride crystal 25 in the present embodiment is a single crystal but includes the first region 25a, second region 25c, and third region 25d having mutually different crystal properties.

The first region 25a is a region disposed in the inner area of the c-plane cross section of the group 13 nitride crystal 25. The inner area of the c-plane cross section is a region that is other than the outer edges of the c-plane cross section and a region extending continuously from the outer edges and is on the inner side of the outer edges and the region extending continuously from the outer edges.

The third region 25d is a region disposed on the outermost side of the c-plane cross section and having crystal properties different from those of the first region 25a. The second region 25c is a transition region of the crystal growth that is disposed at least partially between the first region 25a and the third region 25d in the c-plane cross section.

A description will be given of the case in which the c-plane cross section of the group 13 nitride crystal 25 includes the first region 25a, the second region 25c, and the third region 25d. However, the cross section is not strictly limited to the c-plane cross section. It is sufficient that at least one cross section intersecting the c-axis of the group 13 nitride crystal 25 includes the first region 25a, the second region 25c, and the third region 25d.

The crystal property includes an emission spectrum excited by an electron beam or UV (Ultraviolet light) and measured at room temperature, a dislocation density, and a dislocation direction. In the present embodiment, the difference in crystal properties means a difference in at least one of the emission spectrum, the dislocation density, and the dislocation direction.

In the present embodiment, the room temperature is about 20° C. and specifically 10° C. or higher and 30° C. or lower.

The emission spectrum under electron beam or UV excitation is obtained by measuring photoluminescence (PL) using, for example, a He—Cd laser (helium-cadmium laser) as an excitation light source. However, this is not a limitation. For example, the color and intensity of the spectrum are observed under, for example, a fluorescence microscope, and the observed color may be used for identification.

The dislocation density and dislocation direction are measured as follows. For example, the outermost surface of an object for measurement is etched by mixed acid of sulfuric acid and phosphoric acid, or molten alkalis such as KOH and NaOH, etc. to cause etch pits to appear. Then a photograph of the microstructure of the etched surface of the object for measurement is taken by means of an electron microscope, and an etch pit density (EPD) is computed using the obtained photograph. The EPD corresponds to the dislocation density.

In FIGS. 2 and 3, the second region 25c is disposed in part of the region between the first region 25a and the third region 25d in the c-plane cross section of the group 13 nitride crystal 25. However, it is sufficient that the second region 25c is disposed in at least part of the region between the first region 25a and the third region 25d. Preferably, the second region 25c is disposed so as to cover the entire outer circumference of the first region 25a.

Figure 4:
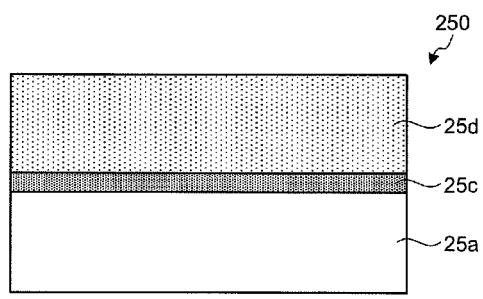
FIG. 4 is a view showing an exemplary cross section of another group 13 nitride crystal parallel to its c-axis and a-axis.
Figure 5:
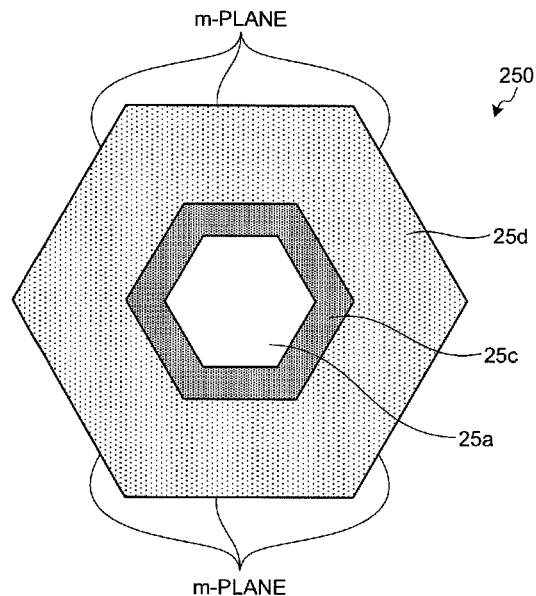
FIG. 5 is a view showing an exemplary c-plane cross section of the group 13 nitride crystal.

FIGS. 4 and 5 show c-plane cross sections of a group 13 nitride crystal 250 having a second region 25c disposed so as to cover the entire outer circumference of the first region 25a. As shown in FIGS. 4 and 5, when the second region 25c is disposed so as to cover the entire outer circumference of the first region 25a, the second region 25c is interposed between the first region 25a and the third region 25d, so that the first region 25a and the third region 25d are not in contact with each other.

When the second region 25c is disposed so as to cover the entire outer circumference of the first region 25a as described above, the third region 25d formed by crystal growth from the seed crystal (first region 25a) via the second region 25c can have higher crystal quality as compared to the case in which the second region 25c is disposed in part of the outer circumference of the first region 25a.

The "seed crystal (first region 25a)" is a group 13 nitride crystal having properties of the first region 25a. In other words, the seed crystal (first region 25a) is a group 13 nitride crystal comprised of the first region 25a. The details of methods of manufacturing the group 13 nitride crystals 25 and 250 and a group 13 nitride crystal 251 described later (see FIG. 6) will be described later.

It is sufficient that each of the group 13 nitride crystals 25 and 250 in the present embodiment includes the first region 25a, the second region 25c, and the third region 25d. These nitride crystals may include another crystal region, defects, etc.

Preferably, each of the group 13 nitride crystals 25 and 250 in the present embodiment is configured to include a forth region.

Figure 6:
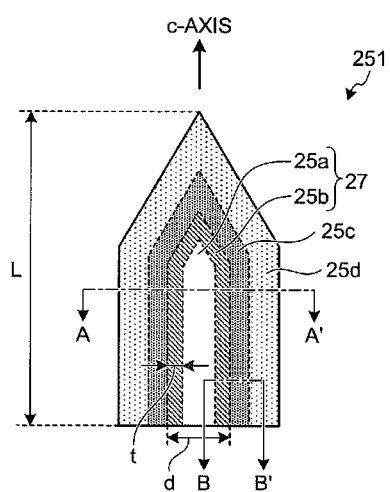
FIG. 6 is a view showing a cross section of another group 13 nitride crystal parallel to its c-axis and a-axis.
Figure 7:
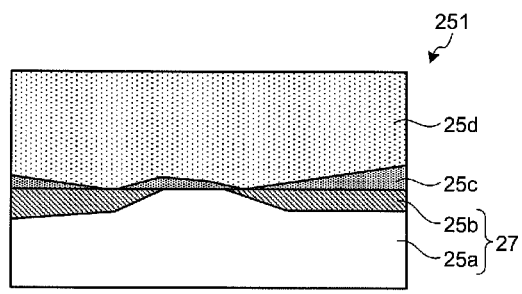
FIG. 7 is a view showing an exemplary cross section of the group 13 nitride crystal parallel to its c-axis and a-axis.
Figure 8:
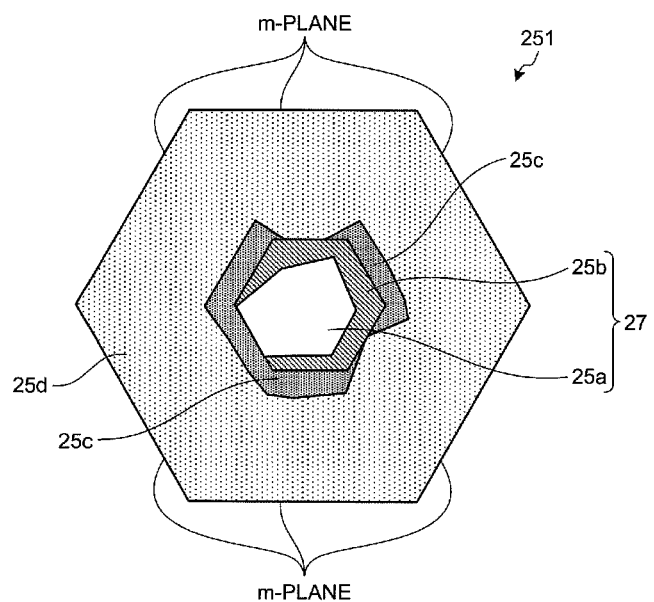
FIG. 8 is a view showing an exemplary c-plane cross section of the group 13 nitride crystal.

FIGS. 6 to 8 show an example of another group 13 nitride crystal in the present embodiment (group 13 nitride crystal 251). More specifically, FIG. 6 is a schematic cross section illustrating an example of the structure of the group 13 nitride crystal 251. FIG. 6 shows a cross section parallel to the c-axis and an a-axis of the group 13 nitride crystal 251 having a hexagonal crystal structure. FIG. 7 shows a cross section intersecting the c-axis of the group 13 nitride crystal 251 and is a B-B' cross section in FIG. 6. FIG. 8 shows a c-plane cross section of the group 13 nitride crystal 251 and is an A-A' cross section in FIG. 6.

The group 13 nitride crystal 251 includes a fourth region 25b, in addition to the first region 25a, the aforementioned second region 25c, and the third region 25d. The fourth region 25b is disposed on the outer side of the first region 25a and on the inner side of the second region 25c in the c-plane cross section of the group 13 nitride crystal 251. The fourth region 25b has crystal properties different from those of the first region 25a, the second region 25c, and the third region 25d.

The fourth region 25b is disposed so as to cover at least part of the outer circumference of the first region 25a. Therefore, the fourth region 25b may be disposed so as to cover the entire outer circumference (i.e., all the m-planes) of the first region 25a. Alternatively, the outer circumference of the first region 25a may include a partial region on which no fourth region 25b is disposed.

As in the above cases, it is sufficient that the group 13 nitride crystal 251 includes, in addition to the first region 25a, the second region 25c, and the third region 25d, the fourth region 25b in at least one cross section intersecting the c-axis, but the cross section is not strictly limited to the c-plane cross section.

When the fourth region 25b covers at least a part of the outer circumference of the first region 25a as described above, if a crystal 27 provided with the fourth region 25b outside of the first region 25a is used as a seed crystal (the crystal 27 may be hereinafter referred to as the seed crystal 27) to grow a group 13 nitride crystal (i.e., the second region 25c and the third region 25d) from the outer circumferential surface of the seed crystal 27, the group 13 nitride crystal 251 can be obtained.

In FIGS. 3, 5, and 8, the c-plane cross sections of the group 13 nitride crystals 25, 250 and 251, or the cross section of their regions are shown as regular hexagons. However, these are only schematically illustrated and not limited to the regular hexagons. The c-plane cross sections of the group 13 nitride crystals 25, 250 and 251, and the c-plane cross sections of their regions (the first region 25a, the fourth region 25b, the second region 25c, and the third region 25d) are formed into substantially hexagonal shapes because they are cross sections of the group 13 nitride crystals having a hexagonal crystal structure. If a different structure is present inside of any of these regions or at any of the boundaries therebetween during the process of crystal growth, the outlines of the hexagons may deform at the boundary with the different structure.

Each of the group 13 nitride crystals 25, 250, and 251 is not always composed only of the above-described regions (the first region 25a, the fourth region 25b, the second region 25c, and the third region 25d). Each of the group 13 nitride crystals 25, 250, and 251 may further include another region (for example, an N-th region (in the present embodiment, N is an integer equal to or larger than 5)) having a different structure or different optical properties.

<Properties of Each Region>
—Light Emitting Properties—

In the emission spectrum from the c-plane cross section of each of the group 13 nitride crystals 25, 250, and 251 according to the present embodiment under electron beam or UV excitation, the peak intensity ratio E1/E2 of the peak intensity E1 of a first peak that is light emission from the band edge and near band edge of the gallium nitride crystal (hereinafter referred to as band edge emission) to the peak intensity E2 of a second peak on the longer wavelength side of the first peak satisfies the relation expressed by the following formula (1).

$$A1 < A2 < A3 \tag{1}$$

In the formula (1), A1 represents the peak intensity ratio E1/E2 in the first region 25a in the c-plane cross section. In the formula (1), A2 represents the peak intensity ratio E1/E2 in the second region 25c in the c-plane cross section. In the formula (1), A3 represents the peak intensity ratio E1/E2 in the third region 25d in the c-plane cross section.

The first peak is light emission including emission from the band edge of gallium nitride in a measurement area of the group 13 nitride crystal 25 (250, 251) (hereinafter this light emission may be simply referred to as band edge emission) and is a peak of the emission spectrum that appears in the wavelength range around 364 nm during measurement at room temperature. The band edge emission of gallium nitride is light emission due to recombination of holes at the upper edge of the valence band in the group 13 nitride crystal 25 (250, 251) and electrons at the bottom of the conduction band and is emission of light having an energy (wavelength) equal to the band gap. More specifically, the first peak is a peak due to the periodic structure of the group 13 nitride crystal 25 (250, 251) and the bond (bonding state) between nitrogen and gallium in the crystal. The first peak may include the band edge emission and near band edge emission.

The second peak is at least one peak that appears on the longer wavelength side of the first peak and is a peak including light emission due to, for example, impurities and defects.

In a more preferred embodiment, the second peak is included in the wavelength range of 450 nm to 650 on in the emission spectrum measured at room temperature under electron beam or UV excitation.

In a still more preferred embodiment, the second peak is included in the wavelength range of 590 nm to 650 nm in the emission spectrum measured at room temperature under electron beam or UV excitation.

The smaller the ratio of the peak intensity E1 of the first peak to the peak intensity E2 of the second peak, the larger the amounts of impurities, defects, and dislocations contained in the measurement area. Therefore, the formula (1) above indicates that the ratio of the amount of at least one of impurities, defects, and dislocations is smallest in the third region 25d, followed by the second region 25c and the first region 25a.

The group 13 nitride crystal 25 (250) can be formed using a seed crystal (first region 25a). Therefore, for example, when there is a need to grow a third region 25d containing a small amount of impurities or the like with using the seed crystal (first region 25a) containing a large amount of impurities or the like, the second region 25c containing a large amount of impurities is first formed between the first region 25a and the third region 25d, and then the third region 25d is formed. It is considered that the crystal quality of the third region 25d can be made more uniform in this manner. It is considered that by concentrating dislocations, impurities, and defects in the second region 25c among the first region 25a, the second region 25c, and the third region 25d, the amounts of dislocations, impurities, and defects in the third region 25d can be reduced. This may allow group 13 nitride crystals 25, 250, and 251 having higher quality to be provided.

In the emission spectra from the c-plane cross sections of the group 13 nitride crystals 25, 250, and 251 according to the present embodiment under electron beam or UV excitation, it is preferable that the peak intensity E2 of the second peak satisfy the relations represented by the following formulae (2A) and (2B).

$$B1 > B3 \quad (2A)$$

$$B2 > B3 \quad (2B)$$

In the formula (2A), B1 represents the peak intensity E2 of the second peak in the first region. In the formula (2B), B2 represents the peak intensity E2 of the second peak in the second region. In the formulae (2A) and (2B), B3 represents the peak intensity E2 of the second peak in the third region.

The higher the peak intensity E2 of the second peak, the larger the amounts of impurities and point defects in the measurement area. Therefore, when the formulae (2A) and (2B) above are satisfied, the ratio of the amount of impurities or point defects is smaller in the third region 25d than in the first region 25a and the second region 25c.

Therefore, when there is a need to grow a third region 25d containing a small amount of impurities or the like from the first region 25a containing a large amount of impurities or the like, the second region 25c is disposed in at least a part of the region between the first region 25a and the third region 25d. This may allow impurities and point defects to be concentrated in the second region 25c, and the amounts of impurities and defects in the third region 25d may thereby be reduced. This may allow group 13 nitride crystals 25, 250, and 251 having higher quality to be provided.

In the emission spectra under electron beam or UV excitation from cross sections of the group 13 nitride crystals 25, 250, and 251 according to the present embodiment that intersect the c-plane, it is preferable that the peak intensity E1 of the first peak satisfies the relations represented by the following formulae (3A) and (3B).

$$C1 < C3 \quad (3A)$$

$$C2 < C3 \quad (3B)$$

In the formula (3A), C1 represents the peak intensity E1 of the first peak in the first region. In the formula (3B), C2 represents the peak intensity E1 of the first peak in the second region. In the formulae (3A) and (3B), C3 represents the peak intensity E1 of the first peak in the third region.

The higher the peak intensity E1 of the first peak, the smaller the amounts of impurities, defects, and dislocations in the measurement area. Therefore, when the formulae (3A) and (3B) are satisfied, the ratio of the amount of at least one of impurities, defects, and dislocations is smaller in the third region 25d than in the first region 25a and the second region 25c.

Therefore, when there is a need to grow a third region 25d containing a small amount of impurities or the like from the first region 25a containing a large amount of impurities or the like, the second region 25c is disposed in at least a part of the region between the first region 25a and the third region 25d. This may allow dislocations, impurities, and defects to be concentrated in the second region 25c, and the amounts of dislocations, impurities, and defects in the third region 25d can thereby be reduced. This may allow group 13 nitride crystals 25, 250, and 251 having higher quality to be provided.

In the first region 25a, the peak intensity of the first peak is smaller than the peak intensity of the second peak. In the fourth region 25b, the peak intensity of the first peak is larger than the peak intensity of the second peak.

No limitation is imposed on the peak intensities of the first and second peaks in the first region 25a and the fourth region 25b so long as the peak intensities satisfy the above relations. However, more preferably, the peak intensity of the first peak in the fourth region 25b is greater than the peak intensity of the first peak in the first region 25a. Preferably, the peak intensity of the second peak in the fourth region 25b is smaller than the peak intensity of the second peak in the first region 25a.

Figure 9:
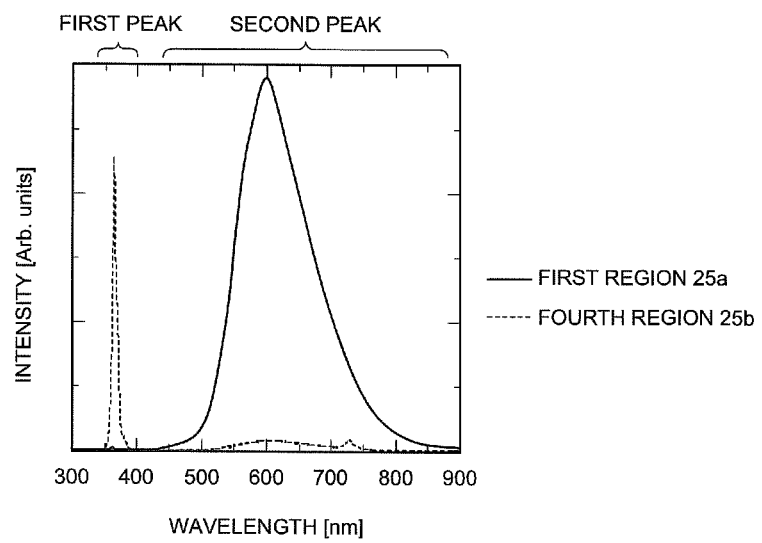
FIG. 9 is a graph showing exemplary spectra of light emission from a first region and a fourth region under electron beam or UV excitation.

FIG. 9 is a graph showing exemplary emission spectra from the first region 25a and the fourth region 25b under electron beam or UV excitation.

In the emission spectrum from the first region 25a, the peak intensity of the second peak is larger than the peak intensity of the first peak. This means that the first region 25a contains relatively large amounts of impurities and/or defects. In the emission spectrum from the fourth region 25b, the peak intensity of the first peak is larger than the peak intensity of the second peak. This means that the fourth region 25b contains relatively small amounts of impurities and/or defects and that the crystal in the fourth region 25b has high quality.

Therefore, when a seed crystal 27 provided with the fourth region 25b disposed outside of the first region 25a is used in a method of manufacturing the group 13 nitride crystal 251 described later, a higher quality group 13 nitride crystal 251 can be more easily manufactured. This may be because the use of the seed crystal 27 provided with the fourth region 25b containing smaller amounts of impurities and/or defects disposed outside of the first region 25a allows crystal growth on the fourth region 25b containing smaller amounts of impurities and/or defects.

When the seed crystal 27 is used to form a group 13 nitride crystal 251 of larger size, the crystal can grow from a region in contact with the fourth region 25b containing smaller amounts of impurities, defects, and the like than the first region 25a. Therefore, an area ratio occupied by the second region 25c in the manufactured group 13 nitride crystal 251 can be reduced, and a larger amount of the third region 25d having high crystal quality and uniform properties can be obtained. Thereby, it is considered that a group 13 nitride crystal 251 having higher quality can be obtained.

In the present embodiment, examples of the impurities may include B, Al, O, Ti, Cu, Zn, Si, Na, K, Mg, Ca, W, C, Fe, Cr, Ni, H and so on.

No limitation is imposed on the thickness t of the fourth region 25b (see FIG. 6). However, for example, the minimum thickness is preferably 100 nm or more.

When a group 13 nitride crystal is grown by a flux method using a gallium nitride crystal as a seed crystal as described in Japanese Patent Application Laid-open No. 2009-126771, meltback of the seed crystal may occur. The amount of meltback (meltback amount) is known to increase when the quality of the seed crystal is low, particularly when a damaged layer remains present therein.

However, when the fourth region 25b, which is a crystal layer having higher quality than the first region 25a, having a thickness of 100 nm or more is present on the outer side of the seed crystal, the fourth region 25b is likely to remain present even if meltback occurs in the process of growing the seed crystal 27 described later, and a higher quality third region 25d can be easily grown.

—Dislocation Density—

An explanation will now be made on dislocations in a crystal.

The density of dislocations in directions intersecting the c-axis is higher in the second region 25c than in the first region 25a and the third region 25d. This is because the second region 25c is a transition region of crystal growth, as described above. Dislocations are more highly concentrated in the second region 25c than in the other regions, as described above. Therefore, superposition of dislocations occurs, and disappearance of the dislocations thereby occurs. Accordingly, the number of dislocations in the third region 25d is less than that in the second region 25c.

The dislocation density C in the c-plane of the third region 25d is lower than the dislocation density M in the m-planes of the third region 25d.

As the dislocation density in the m-planes of the third region 25d, i.e. the m-planes of the group 13 nitride crystals 25, 250 and 251 (in other words, the number of dislocations extending in directions intersecting the c-axis) increases, dislocations in the c-axis direction are not likely to be elongated, and are likely to encounter dislocations in directions intersecting the c-axis. Therefore, in the m-planes of the third region 25d, the encounter with dislocations in the directions intersecting the c-axis causes the dislocations in the c-axis direction to change their directions and/or to disappear. Accordingly, the number of dislocations extending in the c-axis direction in the third region 25d becomes smaller than that in the other regions.

A ratio M/C of the dislocation density M in the m-planes of the third region 25d to the dislocation density C in the c-plane of the third region 25d is preferably larger than 1,000 and more preferably larger than 100,000. When the ratio M/C of the dislocation density M in the m-planes of the third region 25d to the dislocation density C in the c-plane of the third region 25d is in the above range, it is considered that the dislocation density in the c-plane of the third region 25d is likely to be $1 \times 10^2$ cm$^{-2}$ or less.

—Boron Density—

The boron density in the first region 25a is higher than the boron density in the fourth region 25b. More specifically, for example, the boron density in the first region 25a in the group 13 nitride crystal 251 is preferably $4 \times 10^{18}$ atms/cm$^3$ or more, and the boron density in the fourth region 25b disposed outside of the first region 25a is preferably less than $4 \times 10^{18}$ atms/cm$^3$.

More preferably, the boron density in the first region 25a is $6 \times 10^{18}$ atms/cm$^3$ or more, and the boron density in the fourth region 25b is less than $1 \times 10^{18}$ atms/cm$^3$.

If the boron density satisfies the above relationship, the crystal growth can be started mainly from the outer circumferential surface of the high quality fourth region 25b with low boron density, when the crystal 27 provided with the fourth region 25b outside of the first region 25a is used as the seed crystal for crystal growth. Therefore, a high quality group 13 nitride crystal can be manufactured, also in a case that the seed crystal 27 elongated in the c-axis direction by a boron adding process is used to manufacture a group 13 nitride crystal 251 elongated in the c-axis direction.

<Manufacturing Method>

An explanation will now be made on a method of manufacturing the group 13 nitride crystals 25, 250, and 251.

The group 13 nitride crystals 25 and 250 are manufactured by crystal growth from the seed crystal provided with the first region 25a. On the other hand, the group 13 nitride crystal 251 is manufactured by crystal growth from the seed crystal 27 provided with the fourth region 25b outside of the first region 25a.

Each of the seed crystal (first region 25a) and the seed crystal 27 has a hexagonal crystal structure and is elongated in the c-axis direction. The seed crystal (first region 25a) is a seed crystal provided with the first region 25a. The seed crystal 27 is provided with the first region 25a on the inner side and the fourth region 25b on the outer side.

In each of the seed crystal (first region 25a) and the seed crystal 27, a cross section perpendicular to the c-axis (the c-plane) has a hexagonal shape. The side faces of the seed crystal that correspond to the edges of the hexagonal shape are composed mainly of the m-planes of the hexagonal crystal structure.

The details of the manufacturing method will now be explained.

[1] Method of Manufacturing Seed Crystal

<Crystal Manufacturing Apparatus>

Figure 10:
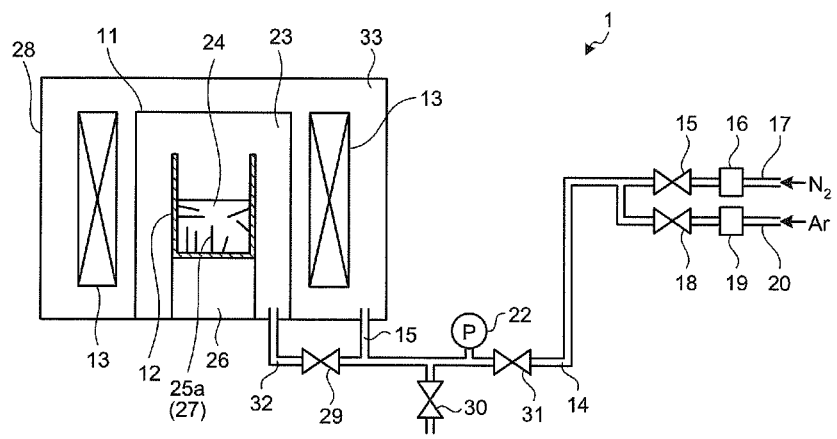
FIG. 10 is a schematic cross section of a crystal manufacturing apparatus for manufacturing a seed crystal.

FIG. 10 is a schematic cross section of a crystal manufacturing apparatus 1 for manufacturing the seed crystal (first region 25a) or the seed crystal 27 in the present embodiment. As shown in FIG. 10, the crystal manufacturing apparatus 1 has a dual structure, in which an inner vessel 11 is disposed inside of an outside pressure resistant vessel 28 made of stainless material, and a reactor vessel 12 is disposed inside of the inner vessel 11. The inner vessel 11 is attachable to and detachable from the outside pressure resistant vessel 28.

The reactor vessel 12 is a vessel for retaining a molten mixture 24 obtained by melting source materials and/or additives to form the seed crystal (first region 25a) or the seed crystal 27. The configuration of the reactor vessel 12 will be described later.

To the outside pressure resistant vessel 28 and the inner vessel 11, gas pipes 15 and 32 are respectively connected to supply nitrogen (N$_2$) gas which is source material of the group 13 nitride crystal and a diluent gas for controlling a whole pressure to an inner space 33 of the outside vessel 28 and an inner space 23 of the inner vessel 11. A gas supplying pipe 14 is branched into a nitrogen supplying pipe 17 and a diluent gas supplying pipe 20 via valves 15 and 18, respectively. These pipes 17 and 20 can be separated at valves 15 and 18, respectively.

Argon (Ar) gas which is inert gas is preferably used as the diluent gas. However, the embodiment is not limited to this. For example, other inert gas such as helium (He) may be used as the diluent gas.

The nitrogen gas is introduced from the nitrogen supplying pipe 17 which is connected to a gas canister or the like containing the nitrogen gas therein. The nitrogen gas from the pipe 17 is subjected to a pressure control by a pressure regulator 16 and then supplied to the gas supplying pipe 14 via the valve 15. On the other hand, the diluent gas (e.g. Ar gas) is introduced from the diluent gas supplying pipe 20 which is connected to a gas canister or the like containing the diluent gas therein. The diluent gas from the pipe 20 is subjected to a pressure control by a pressure regulator 190 and then supplied to the gas supplying pipe 14 via the valve 18. Thus, the pressure regulated nitrogen gas and the pressure regulated diluent gas are supplied to the gas pipe 14 to be mixed there.

The gas mixture of the nitrogen gas and the diluent gas is supplied to the outside vessel 28 via the pipe 15 and the inner vessel 11 via the pipe 32. The inner vessel 11 can be removed from the apparatus 1 at the valve 29.

A pressure meter 220 is disposed on the pipe 14 for monitoring a whole pressure inside of the outside vessel 28 and the inner vessel 11 and controlling pressures inside of the outside vessel 28 and inner vessel 11.

In the embodiment, nitrogen partial pressure can be controlled by controlling the pressures of the nitrogen gas and the diluent gas by means of valves 15 and 18 and the pressure regulators 16 and 19. Since the whole pressure of the outside vessel 28 and the inner vessel 11 can be controlled, it is possible to reduce evaporation of alkali metal (e.g. sodium) in the reactor vessel 12 by increasing the whole pressure of the inner vessel 11. In other words, it is possible to control separately the nitrogen partial pressure which becomes a nitrogen source affecting the crystal growth conditions of GaN and the whole pressure which affects the reduction of sodium evaporation.

As shown in FIG. 10, a heater 13 is disposed around the outer circumference of the inner vessel 11 inside of the outside vessel 28 for heating the inner vessel 11 and the reactor vessel 12 and controlling the temperature of the molten mixture 24.

In the present embodiment, the seed crystal (first region 25a) or the seed crystal 27 is manufactured by a flux method.

In a case that the seed crystal 27 is manufactured, boron is melted into the molten mixture 24 (the boron melting process), the boron is taken into the crystal while the GaN crystal 25 is grown (the boron taking process), and the boron density in the molten mixture 24 is reduced during the crystal growth process (the boron reducing process), in order to grow the crystal with a different boron densities between the inner side and the outer side of the seed crystal 27.

In a case that the first region 25a is manufactured as the seed crystal, boron is melted into the molten mixture 24, and the boron is taken into the crystal while the GaN crystal 25 is grown. There is no need to reduce the boron density in the molten mixture during the crystal growth process. Therefore, the following explanation is for manufacturing the seed crystal 27.

In the boron melting process, the boron is melted into the molten mixture 24 from boron nitride (BN) contained in the inner wall of the reactor vessel 12 or from a boron nitride component disposed inside of the reactor vessel 12. Then, the melted boron is taken into the crystal while the gallium nitride crystal 27 grows (the boron taking process). An amount of boron taken into the gallium nitride crystal 27 is gradually reduced as the crystal grows (the boron reducing process).

Due to the boron reducing process, it is possible to reduce the boron density of the outer region in a cross section intersecting the c-axis in comparison with the boron density of the inner region in the cross section, while the seed crystal 27 grows with growing the m-planes ({10-10} planes). Thereby, the density of boron as an impurity can be reduced and the dislocation density which may be induced by the impurities can be reduced, at the outer circumference surface comprised of the m-planes (six side surfaces of the hexagonal column) of the seed crystal 27. Thus, the outer circumference of the seed crystal 27 can be made of the higher quality crystal in comparison with the inner region.

In a manufacturing process as described in the following [3] to form the group 13 nitride crystal 251 from the seed crystal 27, the group 13 nitride crystal 251 is grown mainly from side surfaces of the seed crystal 27 (the outer circumference surface comprised of m-planes) as start points of the crystal growth. Thereby, if the outer circumference surface comprised of m-planes of the seed crystal 27 is of a good quality as described above, the crystal grown from the surface becomes of a good quality. Therefore, according to the embodiment, by growing a large and high quality seed crystal 27, the obtained group 13 nitride crystal 251 can be good quality.

Next, a further detail explanation will be made on the boron melting process, the boron taking process and the boron reducing process.

(1) Method that Reactor Vessel 12 Contains Boron Nitride

In an example of the boron melting process, a reactor vessel 12 made of a sintered BN (sintered boron nitride) can be used as the reactor vessel 12. In the course of heating the reactor vessel 12 to a crystal growth temperature, boron is melted from the reactor vessel 12 into the molten mixture 24 (the boron melting process). Then, the boron in the molten mixture 24 is taken into the seed crystal 27 in the course of growing the seed crystal 27 (the boron taking process). The boron in the molten mixture is gradually reduced as the seed crystal 27 grows (the boron reducing process).

In the aforementioned example, the reactor vessel 12 made of the sintered BN is used. However, the reactor vessel 12 is not limited to this. In a preferable embodiment, it is sufficient that the reactor vessel 12 includes a BN-contained material (e.g. sintered BN) at a part at least of its inner wall coming into contact with the molten mixture 24. The other part of the reactor vessel 12 may be made of nitride such as pyrolytic BN (P-BN) and the like, oxide such as alumina, YAG and the like, carbide such as SiC and the like.

(2) Process that BN-Contained Material is Placed in the Reactor Vessel 12

In another example of melting the boron, a BN-contained material may be placed in the reactor vessel 12. As an example, a sintered BN may be placed in the reactor vessel 12. Materials for the reactor vessel 12 are not limited to any particular one similarly to the process (1).

In this method, in the course of heating the reactor vessel 12 to a crystal growth temperature, boron is gradually melted from the material placed in the reactor vessel 12 into the molten mixture 24 (the boron melting process).

In the processes (1) and (2), crystal nuclei of GaN crystal are likely to be formed on a surface of the BN-contained material coming into contact with the molten mixture 24. Therefore, if the BN surface (i.e. the inner wall surface or the material surface) is gradually covered with the GaN crystal nuclei, the amount of boron melted from the covered BN material into the molten mixture 24 gradually decreases (the boron reducing process). Furthermore, in accordance with the growth of the GaN crystal, a surface area of the crystal gradually increases and thereby the density of boron which is taken into the GaN crystal decreases (the boron reducing process).

In the method (1) and (2), the boron-contained material is used for melting the boron into the molten mixture 24. A method or process for melting the boron into the molten mixture 24 is not limited to this. For example, boron may be added into the molten mixture 24, or any other process may be used. As for a method or process for reducing the boron density in the molten mixture 24, any other method or process may be used. The crystal manufacturing process according to the embodiment sufficiently includes the boron melting process, the boron taking process and the boron reducing process, as mentioned above at least.

<Preparation of Materials or the Like, and Crystal Growth Conditions>

An operation to put the source material or the like into the reactor vessel 12 is conducted in such a manner that the pressure resistant vessel 11 is put into a glove box under an inert gas atmosphere such as Ar.

In a case that the seed crystal 27 is grown by the process (1), the boron-contained material as mentioned in the explanation of the process (1), a material used as a flux, and source material(s) are put into the reactor vessel 12 as mentioned in the explanation of the process (1).

In a case that the seed crystal 30 is grown by the process (2), a material used as a flux and source material(s) are put into the reactor vessel 12 as mentioned in the explanation of the process (2).

The material used as flux may be sodium, or sodium compound (e.g. sodium azide). Any other material including other alkali metals such as lithium and potassium, or compounds of these alkali metals may be used as the flux. Furthermore, alkali earth metals such as barium, strontium, and magnesium, or compounds of these alkali earth metals may be used as the flux. A plurality kind of alkali metals or alkali earth metals may be used.

As the source material, gallium is used. Any other materials including without limitation other group 13 elements such as boron, aluminum and indium, or mixtures thereof may be used as source material(s) to be put into the reactor vessel 12.

In the embodiment, the reactor vessel 12 contains boron. The reactor vessel 12 may further contain at least one from B, Al, O, Ti, Cu, Zn, and Si, without limiting to only boron.

After setting the source material(s) as mentioned above, the inner vessel 11 and the reactor vessel 12 inside of the inner vessel 11 are heated to a crystal growth temperature by turning on the heater 13. Then, the source material is melted with the material used as the flux in the reactor vessel 12 to form the molten mixture 24. Nitrogen as the source material of the seed crystal 27 can be supplied to the molten mixture 24 by bring the nitrogen having the aforementioned partial pressure into contact with the molten mixture 24 and thereby dissolving the nitrogen into the molten mixture 24. Furthermore, boron is melted into the molten mixture 24 as described above (the boron melting process and the molten mixture forming process).

Crystal nuclei of the seed crystal 27 are formed on the inner wall of the reactor vessel 12 from source materials and boron which are melted in the molten mixture 24. The source materials and boron in the molten mixture 24 are supplied to these nuclei to grow the nuclei to the needle-like seed crystal 27. In the course of the crystal growth of the seed crystal 27, as described above, boron in the molten mixture 24 is taken into the seed crystal 27 (the boron taking process), so that the "boron-rich" first region 25*a* is likely to be formed on the inner side of the seed crystal 27, and the seed crystal 27 is likely to be elongated in the c-axis. As the boron density in the molten mixture 24 reduces, the amount of boron taken into the crystal reduces (the boron reducing process). Thus, the "boron-poor" fourth region 25*b* is likely to be formed on the outside of the first region 25*a*, and the seed crystal 27 is likely to grow toward m-axes while the growth toward the c-axis slows or reduces.

Preferably, the partial pressure of nitrogen in the pressure resistant vessel 11 is 5 MPa to 10 MPa.

Preferably, the temperature in the molten mixture 24 (the crystal growth temperature) is 800 degrees Celsius to 900 degrees Celsius.

In a preferable embodiment, a mol ratio of alkali metal mol number to the total mol number of gallium and alkali metal (e.g. sodium) is 75% to 90%, the crystal growth temperature of the molten mixture 24 is 860 degrees Celsius to 900 degrees Celsius, and the partial pressure of nitrogen is 5 MPa to 8 MPa.

In a further preferable embodiment, the mol ratio of gallium to alkali metal is 0.25:0.75, the crystal growth temperature is 860 degrees Celsius to 870 degrees Celsius, and the partial pressure of nitrogen is 7 MPa to 8 MPa.

[2] Seed Crystal

Via the aforementioned processes, there is obtained the seed crystal 27 which is to be used for manufacturing the group 13 nitride crystal 251 and which includes the fourth region 25*b* outside of the first region 25*a*. As mentioned above, by conducting the first process to form the first region 25*a* of gallium nitride crystal containing boron without conducting the second process, there is obtained the seed crystal made of the first region 25*a*.

[3] Manufacturing Method of Group 13 Nitride Crystal

The group 13 nitride crystal 25, 250, or 251 as explained above is manufactured by using the seed crystal made of the first region 25*a* mentioned in [2] or the seed crystal 27 provided with the fourth region 25*b* outside of the first region 25*a*, and enlarging the c-plane cross sectional area of these seed crystals.

<Crystal Manufacturing Apparatus>

Figure 11:
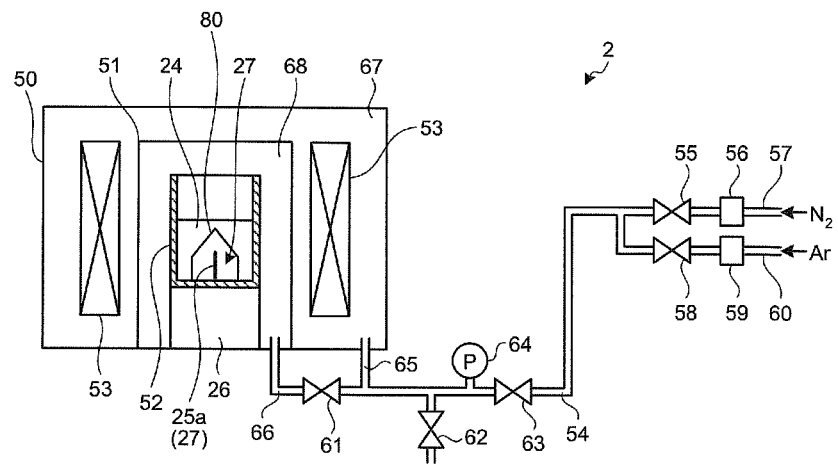
FIG. 11 is a schematic cross section of a crystal manufacturing apparatus for manufacturing a group 13 nitride crystal.

FIG. 11 schematically shows an exemplary structure of the crystal manufacturing apparatus 2 used for manufacturing the group 13 nitride crystal 25, 250, or 251 through the crystal growth from the seed crystal made of the first region 25*a* or the seed crystal 27. The crystal manufacturing apparatus 2 is provided with an outside pressure resistant vessel 50 made of stainless material. An inner vessel 51 is disposed in the stainless outside vessel 50. A reactor vessel 52 is disposed in the inner vessel 51. Thus, the apparatus 2 has a double vessel structure. The inner vessel 51 is attachable to and detachable from the outside pressure resistant vessel 50. Hereinafter, an explanation will be made on a case that the seed crystal 27 is used as the seed crystal.

The use of the seed crystal (first region 25*a*) allows the group 13 nitride crystals 25 and 250 to be manufactured. The use of the seed crystal 27 allows the group 13 nitride crystal 251 to be manufactured.

The reactor vessel 52 is a vessel used to hold the seed crystal 27 and a molten mixture 24 containing an alkali metal and a material containing at least a group 13 element so that crystal growth from the seed crystal 27 is performed (the growth of a bulk crystal from a seed crystal is referred to as SG (seed growth)).

No particular limitation is imposed on the material of the reactor vessel 52, and any of nitrides such as sintered BN and P—BN, oxides such as alumina and YAG, carbides such as SiC, etc. can be used. Preferably, the inner wall surface of the reactor vessel 52, i.e., a portion of the reactor vessel 52 that comes into contact with the molten mixture 24, is formed of a material less likely to react with the molten mixture 24. Examples of the material that allows crystal growth of gallium nitride may include nitrides such as boron nitride (BN), pyrolytic BN (P—BN), and aluminum nitride, oxides such as alumina and yttrium-aluminum-garnet (YAG), and stainless steel (SUS).

In the outside pressure resistant vessel 50 and the inner vessel 11, gas supply tubes 65 and 66 for supplying nitrogen ($N_2$) gas used as a raw material of the group 13 nitride crystal and diluent gas for controlling the total pressure are connected to the inner space 67 of the outside pressure resistant vessel 50 and the inner space 68 of the inner vessel 51, respectively. A gas supply tube 54 branches into a nitrogen supply tube 57 and a gas supply tube 60 and can be separated from these tubes by valves 55 and 58, respectively.

Preferably, inertial argon (Ar) gas is used as the diluent gas, but this is not a limitation. Other inert gas such as helium (He) may be used as the diluent gas.

The nitrogen gas is supplied from the nitrogen supply tube 57 connected to, for example, a nitrogen gas cylinder. The pressure of the nitrogen gas is regulated by a pressure regulator 56, and the resultant nitrogen gas is supplied to the gas supply tube 54 through the valve 55. The gas (for example, argon gas) for regulating the total pressure is supplied from the total pressure regulating gas supply tube 60 connected to, for example, a total pressure regulating gas cylinder. The pressure of the gas is regulated by a pressure regulator 59, and the resultant gas is supplied to the gas supply tube 54 through the valve 58. The pressure-regulated nitrogen gas and the pressure-regulated total pressure regulating gas described above are supplied to the gas supply tube 54 and mixed therein.

The gas mixture of the nitrogen gas and the diluent gas is supplied from the gas supply tube 54 to the outside pressure resistant vessel 50 and the inner vessel 51 through the gas supply tubes 65 and 66, respectively. The inner vessel 51 can be removed from the crystal manufacturing apparatus 2 at a valve 61.

A pressure gauge 64 is disposed in the gas supply tube 54, so that the pressure in the outside pressure resistant vessel 50 and the pressure in the inner vessel 51 can be controlled while the total pressure in the outside pressure resistant vessel 50 and the total pressure in the inner vessel 51 are monitored by the pressure gauge 64.

In the present embodiment, the nitrogen partial pressure can be controlled by controlling the pressure of the nitrogen gas and the pressure of the diluent gas by the valves 55 and 58 and the pressure regulators 56 and 59. Since the total pressure in the outside pressure resistant vessel 50 and the total pressure in the inner vessel 51 can be controlled, evaporation of an alkali metal (for example, sodium) in the reactor vessel 52 can be suppressed by increasing the total pressure in the inner vessel 51. In other words, the partial pressure of nitrogen used as a nitrogen raw material that affects the crystal growth conditions of gallium nitride and the total pressure that affects the suppression of evaporation of sodium can be controlled separately.

As shown in FIG. 11, a heater 53 is disposed on the outer circumference of the inner vessel 51 in the outside pressure resistant vessel 50, so that the temperature of the molten mixture 24 can be controlled by heating the inner vessel 51 and the reactor vessel 52.

<Preparation of Raw Materials Etc. and Crystal Growth Conditions>

The operation of placing the seed crystal 27, raw materials such as Ga, Na, and a dopant such as C, etc. in the reactor vessel 52 is performed with the inner vessel 51 being placed in a glove box with an inert gas atmosphere such as an argon gas atmosphere. This operation may be performed with the reactor vessel 52 being placed in the inner vessel 51.

The seed crystal 27 described in [2] above is placed in the reactor vessel 52. A material containing at least a group 13 element (for example, gallium) and a material used as the flux are also placed in the reactor vessel 52.

Sodium or a sodium compound (for example, sodium azide) is used as the material used as the flux. Other examples of the usable material include other alkali metals such as lithium and potassium and compounds of these alkali metals. Any of alkaline-earth metals such as barium, strontium, and magnesium and compounds of these alkaline-earth metals may also be used. A plurality of alkali metals or alkaline-earth metals may be used.

For example, gallium (a group 13 element) is used as the material containing a group 13 element used as a raw material. Other examples of the raw material may include other group 13 elements such as boron, aluminum, and indium, and any mixture thereof may also be used.

No particular limitation is imposed on the molar ratio of the material containing a group 13 element to the alkali metal. However, the molar ratio of the alkali metal to the total number of moles of the group 13 metal and the alkali metal is preferably 40% to 95%.

After the raw materials are placed as described above, the heater 53 is energized to heat the inner vessel 51 and the reactor vessel 52 thereinside to crystal growth temperature. Then the material containing the group 13 element used as a raw material, the alkali metal, other additives, etc. are melted in the reactor vessel 52, and a molten mixture 24 is thereby formed. Nitrogen having the above-described partial pressure is brought into contact with the molten mixture 24 to dissolve the nitrogen into the molten mixture 24, and the nitrogen used as a raw material of the group 13 nitride crystal 251 (25, 250) can thereby be supplied to the molten mixture 24 (a molten mixture forming process).

Then the raw materials dissolved in the molten mixture 24 are supplied to the outer circumferential surfaces of the seed crystal 27. These raw materials form a second region 25c, which is a transition region of crystal growth, on the outer circumferential surfaces of the seed crystal 27, and then a third region 25d is crystal-grown (a crystal growth process).

As described above, after the second region 25c is crystal-grown from the outer circumferential surfaces of the seed crystal 27, the third region 25d is crystal-grown, and the group 13 nitride crystal 251 including the seed crystal 27 can thereby be manufactured. When the seed crystal (first region 25a) is used instead of the seed crystal 27, the group 13 nitride crystal 25 (250) can be manufactured.

In a preferred embodiment, the partial pressure of the nitrogen gas in the inner space 68 of the inner vessel 51 and in the inner space 67 of the outside pressure resistant vessel 50 is preferably at least 0.1 MPa. In a more preferred embodiment, the partial pressure of the nitrogen gas in the inner space 68 of the inner vessel 51 and in the inner space 67 of the outside pressure resistant vessel 50 is preferably in the range of 2 MPa to 5 MPa.

In a preferred embodiment, the temperature of the molten mixture 24 (the crystal growth temperature) is preferably at least 700° C. In a more preferred embodiment, the crystal growth temperature is preferably in the range of 850° C. to 900° C.

The conditions for a single crystal growing process can be appropriately selected according to the group 13 nitride crystal 25 (250, 251) to be formed.

As described above, when the group 13 nitride crystal is grown from the seed crystal 27 or the seed crystal (first region 25a), the dislocation density of the group 13 nitride crystal grown mainly from the outer circumferential surfaces composed of the m-planes of the seed crystal 27 or the seed crystal (first region 25a) is considered to be affected by the quality of the outer circumferential surfaces of the seed crystal 27 or the seed crystal (first region 25a).

As described in [2] above, the outer circumferential surfaces of the seed crystal 27 that are composed of its en-planes have low dislocation density and high quality. Therefore, when the seed crystal 27 is used as the seed crystal and a group 13 nitride crystal is grown using the seed crystal 27, the number of dislocations propagating from the seed crystal 27 to the group 13 nitride crystal can be reduced. The dislocation density of the manufactured group 13 nitride crystal 251, more specifically, the dislocation density in the third region 25d, can thereby be suppressed to be low. This may allow a large and high-quality group 13 nitride crystal 251 to be easily manufactured.

In the crystal manufacturing method in the present embodiment, the seed crystal (first region 25a) or the seed crystal 27 and the group 13 nitride crystal (the second region 25c and the third region 25d) grown from the seed crystal can be formed of the same material (for example, gallium nitride). Therefore, in contrast to the case in which a seed crystal formed of a different material such as aluminum nitride (AlN) is used, the lattice constants and thermal expansion coefficients of the seed crystal and the group 13 nitride crystal can be matched, and occurrence of dislocations due to the differences in lattice constant and thermal expansion coefficient can be suppressed.

In addition, the fourth region 25b, the second region 25c, the third region 25d, and the seed crystal 27 or the seed crystal (first region 25a) are manufactured by the same crystal growth method (the flux method). Therefore, the degree of matching between the lattice constants and the degree of matching between the thermal expansion coefficients can be improved as compared to those when the fourth region 25b, the second region 25c, the third region 25d, and the seed crystal 27 or the seed crystal (first region 25a) are manufactured using different methods, so that the occurrence of dislocations can be easily suppressed.

High quality group 13 nitride crystals 25, 250, and 251 having a practical size and low dislocation density can be manufactured through the above-described processes.

The crystal manufacturing method according to the flux method has been described above. However, no particular limitation is imposed on the crystal manufacturing method. Crystal growth may be performed using a vapor phase growth method such as an HVPE method or a liquid phase method other than the flux method. However, from the viewpoint of manufacturing high quality group 13 nitride crystals 25, 250, and 251, the flux method is preferably used.

The group 13 nitride crystals 25, 250, and 251 manufactured by the manufacturing method described in [3] have, for example, the shapes of group 13 nitride crystals 80 to 83 shown in FIGS. 12 to 15.

FIGS. 12 to 15 are schematic diagrams illustrating examples of the shapes of the group 13 nitride crystals 25, 250, and 251 in the present embodiment. In FIGS. 12 to 15, the shapes of the group 13 nitride crystals 25, 250, and 251 are represented by the shapes of the group 13 nitride crystals 80 to 83.

As shown in FIGS. 12 to 15, in each of the group 13 nitride crystals 80 (25, 250, 251) (see FIG. 12), 81 (25, 250, 251) (see FIG. 13), 82 (25, 250, 251) (see FIG. 14), and 83 (25, 250, 251) (see FIG. 15), the seed crystal (first region 25a) or the seed crystal 27 is included inside of the group 13 nitride.

Figure 13:
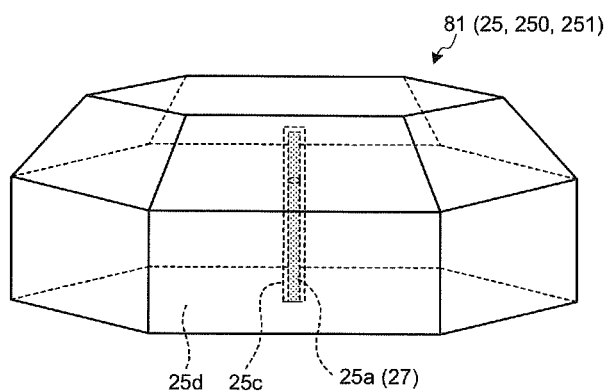
FIG. 13 is an external perspective view illustrating an example of the group 13 nitride crystal.
Figure 14:
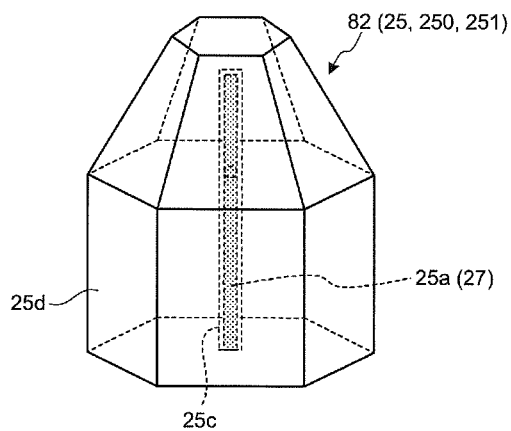
FIG. 14 is an external perspective view illustrating an example of the group 13 nitride crystal.
Figure 15:
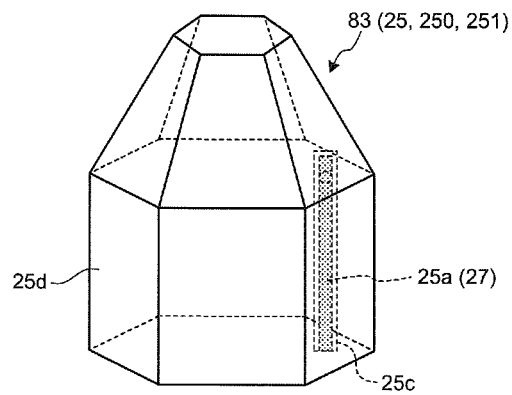
FIG. 15 is an external perspective view illustrating an example of the group 13 nitride crystal.

In the group 13 nitride crystals 80 to 83, it is sufficient that the seed crystal (first region 25a) or the seed crystal 27 is located inside of the group 13 nitride crystals 80 to 83. The seed crystal (first region 25a) or the seed crystal 27 may be included in the vicinity of the center of each of the group 13 nitride crystals 80 to 82 (the vicinity of the center of a hexagonal cross section) as shown in FIGS. 12 to 14 or may be included in a circumferential portion of the group 13 nitride crystal 83 (a region closer to an edge of the hexagon than the center) as shown in FIG. 15.

Figure 12:
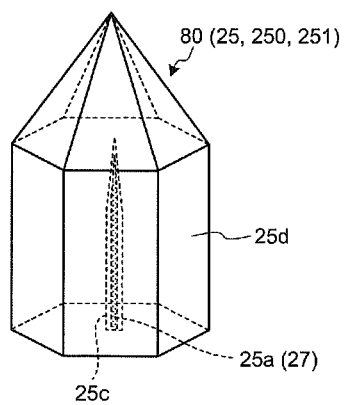
FIG. 12 is an external perspective view illustrating an example of the group 13 nitride crystal.

For example, in the example in FIG. 12, the illustrated group 13 nitride crystal 80 (25, 250, 251) has a shape composed of a hexagonal columnar crystal and a hexagonal pyramid placed thereon with the upper face of the hexagonal column serving as the bottom of the hexagonal pyramid. However, no particular limitation is imposed on the shapes of the group 13 nitride crystals 80 to 83, and these may have a hexagonal pyramid shape with no m-planes formed.

<Dislocation Density>

Figure 16:
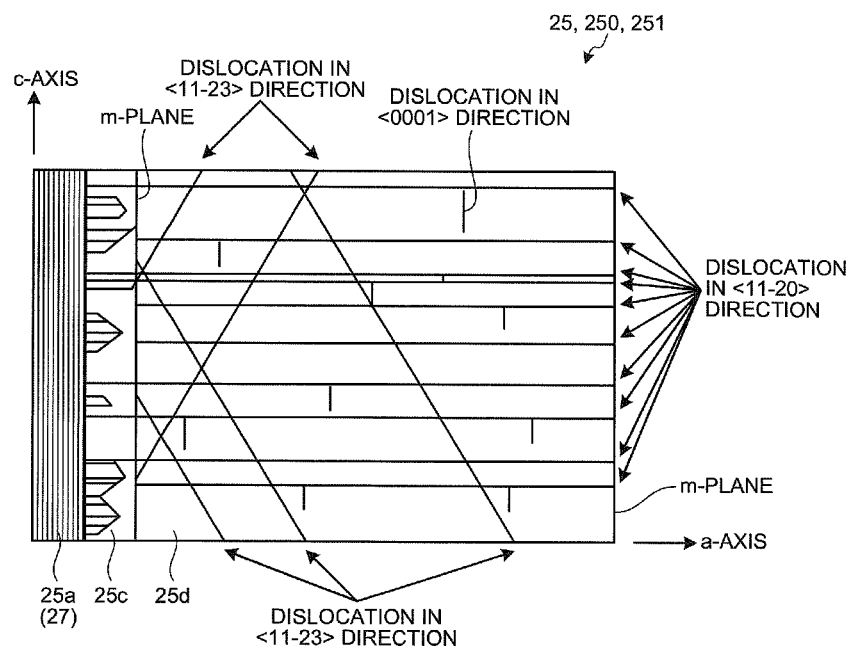
FIG. 16 is a schematic diagram illustrating dislocations in a cross section parallel to the c-axis and an a-axis of a group 13 nitride crystal.

An explanation will now be made on dislocations in a crystal by way of examples. FIG. 16 is a schematic diagram illustrating dislocations in a cross section parallel to the c-axis and an a-axis of the group 13 nitride crystal 25 (250, 251). The cross section parallel to the c-axis and a-axis of the group 13 nitride crystal 25 (250, 251) shown in FIG. 16 is an enlarged part on the right side of the first region 25a or the seed crystal 27.

Generally, even when a group 13 nitride crystal 25 (250, 251) is grown by any of the flux method, the HVPE method, etc., not a small number of dislocations are generated in the crystal. When dislocations are present on the outer circumferential surfaces of the seed crystal (first region 25a) or the seed crystal 27, these dislocations may propagate into the group 13 nitride crystal (the second region 25c, the third region 25d) during growth of the group 13 nitride crystal from the outer circumferential surfaces of the seed crystal. It has been considered that the causes of the occurrence of dislocations are the differences in thermal expansion coefficient and lattice constant between the seed crystal and the group 13 nitride crystal grown from the seed crystal and crystal strain and defects such as cracks on the surfaces of the seed crystal.

However, in the present embodiment, the third region 25d is crystal-grown from the seed crystal (first region 25a) or the seed crystal 27 through the second region 25c, which is the transition region of crystal growth. Therefore, the dislocation density in the third region 25d of the group 13 nitride crystal 25 (250, 251) can also be easily reduced.

Generally, dislocations (line defects) extending in a direction parallel to the direction of crystal growth continue to extend without disappearance during crystal growth. However, line defects extending in directions not parallel to the direction of crystal growth often disappear during crystal growth. More specifically, as shown in FIG. 16, the third region 25d is grown from the m-planes (the outer circumferential surfaces) of the seed crystal (first region 25a) or the seed crystal 27 in the m-axis directions (i.e., the directions in which the size of a hexagonal c-plane cross section increases). Therefore, the number of dislocations generated from the growth boundary of the seed crystal is large in <11-20> directions parallel to the directions of crystal growth and is small in <11-23> directions not parallel to the directions of crystal growth.

Dislocation directions intersecting the c-plane of the hexagonal group 13 nitride crystal include <0001> direction and <11-23> directions. However, in the present embodiment, dislocations in the <0001> direction are not created, and also the number of dislocations in the <11-23> directions is small.

Therefore, in a preferred embodiment, the dislocation density in the c-plane of the third region 25d of the group 13 nitride crystal 25 (250, 251) is smaller than the dislocation density in the region inside of the third region 25d.

[5] Method of Manufacturing Crystal Substrate

A method of manufacturing a crystal substrate according to the present embodiment is a method of manufacturing a crystal substrate 100 using one of the group 13 nitride crystals 80 to 83 (25, 250, 251) described above.

Figure 17:
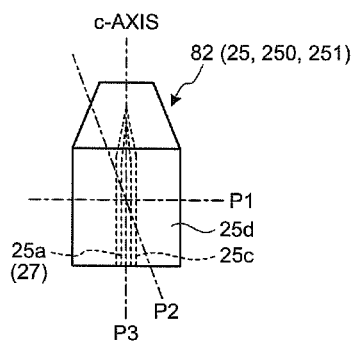
FIG. 17 is a schematic diagram illustrating directions in which a group 13 nitride crystal is to be sliced.
Figure 18:
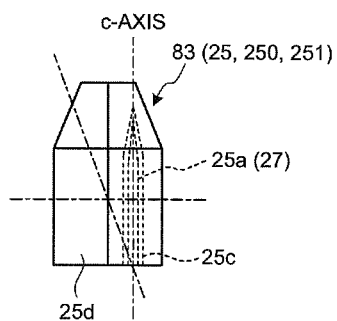
FIG. 18 is a schematic diagram illustrating directions in which a group 13 nitride crystal is to be sliced.

FIGS. 17 and 18 are schematic diagrams illustrating directions in which the group 13 nitride crystal 82 (see FIG. 14) is to be sliced and directions in which the group 13 nitride crystal 83 (see FIG. 15) is to be sliced, respectively. FIGS. 19A to 19C and 20A to 20C are schematic diagrams illustrating examples of crystal substrates 100 (100a to 100f) obtained by slicing.

The manufacturing method in the present embodiment includes the process of slicing one of the group 13 nitride crystals 80 to 83 (25, 250, 251) to cut a crystal substrate 100 such that the crystal substrate 100 contains at least part of the seed crystal (first region 25a) or the seed crystal 27. For example, the crystal substrate 100a shown in FIG. 19A may be obtained by slicing a group 13 nitride crystal orthogonal to the c-axis of the seed crystal (first region 25a) or the seed crystal 27, as indicated by dotted-dashed line P1 in FIG. 17. The crystal substrate 100b shown in FIG. 19B may be obtained by slicing a group 13 nitride crystal in a direction inclined with respect to the c-axis of the seed crystal (first region 25a) or the seed crystal 27, as indicated by dotted-dashed line P2 in FIG. 17. The crystal substrate 100c shown in FIG. 19C may be obtained by slicing a group 13 nitride crystal parallel to the c-axis of the seed crystal (first region 25a) or the seed crystal 27, as indicated by dotted-dashed line P3 in FIG. 17.

The crystal substrates 100 (100a to 100f) are subjected to various types of processing such as shape processing and surface processing after slicing and are processed into the final crystal substrates 100 (100a to 100f) of group 13 nitride shown in FIGS. 19A to 19C and 20A to 20C.

In the manufacturing method in the present embodiment, the crystal substrates 100 are cut from the group 13 nitride crystals 80 to 83 (25, 250, 251) elongated in the c-axis direction, as described above. Therefore, the main faces of the substrates can have a large area when the substrates are cut along the c-plane and also when the substrates are cut along a plane other than the c-plane. More specifically, in the present embodiment, a large-area crystal substrate 100 can be manufactured with any of crystal planes such as the c-plane, m-planes, a-planes, {10-11} planes, {20B1} planes, and {11-22} planes serving as the main face. Therefore, a crystal substrate 100 that has a practical size and can be used for various semiconductor devices can be manufactured.

[6] Crystal Substrates

The crystal substrates according to the present embodiment are crystal substrates 100 manufactured by the manufacturing method described in [5] above. More specifically, each crystal substrate 100 in the present embodiment includes at least part of the first region 25a or the seed crystal 27 described in [2] above.

As shown in FIGS. 19A to 19C and 20A to 20C, each of the crystal substrates 100 (100a to 100f) in the present embodiment contains the first region 25a or the seed crystal 27 used in the crystal manufacturing processes described in [3] above. In addition, at least part of the outer circumferential surfaces composed of the m-planes of the seed crystal (first region 25a) or the seed crystal 27 is covered with the group 13 nitride crystal (the second region 25c, the third region 25d) grown from the seed crystal (first region 25a) or the seed crystal 27.

In a more preferred embodiment, it is preferable that the entire outer circumferential surfaces composed of the m-planes of the seed crystal (first region 25a) or the seed crystal 27 are covered with the second region 25c and the third region 25d.

Figure 19A:
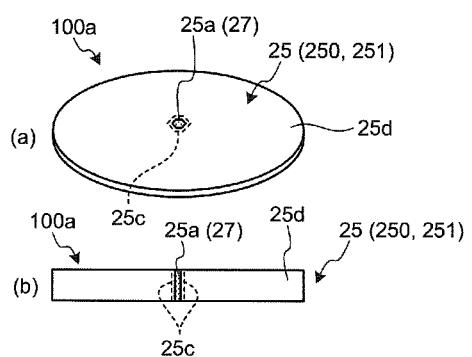
FIG. 19A is a schematic diagram illustrating an example of a crystal substrate.
Figure 19B:
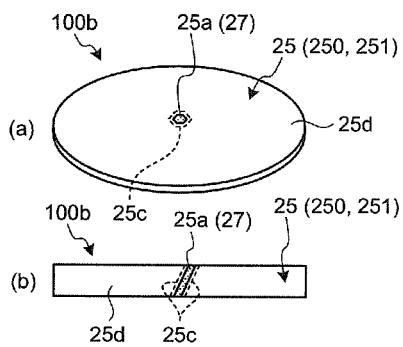
FIG. 19B is a schematic diagram illustrating another example of the crystal substrate.

No limitation is imposed on the position of the seed crystal (first region 25a) or the seed crystal 27 so long as it is included inside each of the group 13 nitride crystals 80 to 83 (25, 250, 251). For example, as shown in FIGS. 19A and 19B, the seed crystal 27 (or the seed crystal (first region 25a)) may be disposed near the center of the main face of the crystal substrate 100. In this case, the c-axis of the seed crystal 27 or the seed crystal (first region 25a) may be disposed so as to be perpendicular to the main face of the substrate as shown in FIG. 19A or may be inclined with respect to the main face of the substrate as shown in FIG. 19B.

Figure 19C:
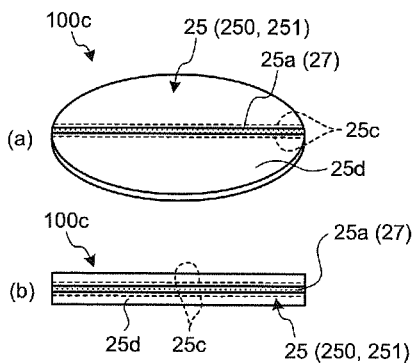
FIG. 19C is a schematic diagram illustrating another example of the crystal substrate.
Figure 20A:
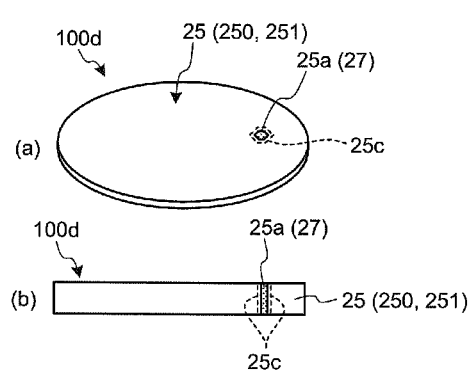
FIG. 20A is a schematic diagram illustrating another example of the crystal substrate.
Figure 20B:
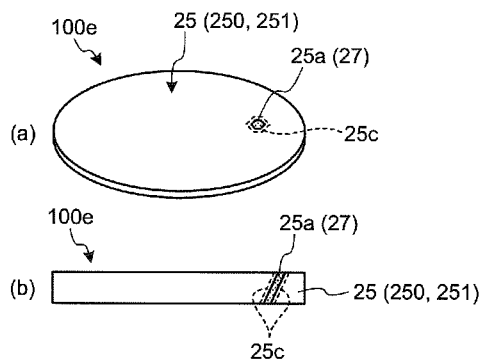
FIG. 20B is a schematic diagram illustrating another example of the crystal substrate.
Figure 20C:
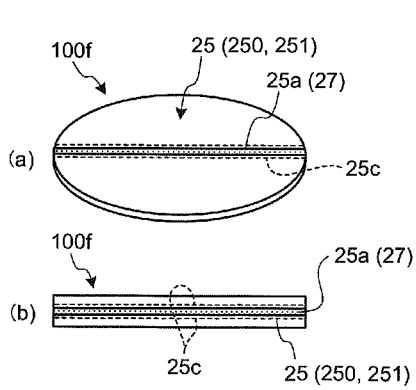
FIG. 20C is a schematic diagram illustrating another example of the crystal substrate.

As shown in FIGS. 19C and 20C, the seed crystal (first region 25a) or the seed crystal 27 may be disposed such that the c-axis of the seed crystal is parallel to the main face of the substrate. The seed crystal (first region 25a) or the seed crystal 27 may be disposed in a region other than the vicinity of the center of the main face of the crystal substrate 100. For example, as shown in FIGS. 20A and 20B, the seed crystal (first region 25a) or the seed crystal 27 may be disposed in a circumferential portion of the main face of the crystal substrate 100.

In a preferred embodiment, the main face of the crystal substrate 100 is preferably the c-plane of the hexagonal crystal.

More preferably, the main face of the crystal substrate 100 is the c-plane, and the off-angle of the crystal substrate 100 with respect to the c-axis direction is 0.1° or smaller.

In the present embodiment, the off-angle is an angle θ which is the smaller one of the angel between the crystal substrate 100 and the c-axis direction and the angle between the crystal substrate 100 and a direction perpendicular to the c-plane. The off-angle can be measured by X-ray analysis.

In a conventional group 13 nitride crystal substrate, the number of dislocations piercing the c-plane is larger than that in the crystal substrate 100 in the present embodiment (specifically $10^6$ cm$^{-2}$ or higher). Therefore, in the conventional group 13 nitride crystal substrate, the off-angle must be larger than 0.1°. This is because when an electronic device is manufactured on a substrate including a large number of dislocations piercing the c-plane, the dislocations piercing the c-plane adversely affect the device unless the off-angle is larger than 0.1°. However, in the crystal substrate 100 in the present embodiment, the number of dislocations piercing the c-plane is small, as described above. Therefore, even when the off-angle is 0.1° or smaller, a high-quality electronic device can be formed on the c-plane substrate.

As described above, in the group 13 nitride crystal 27 according to the preferred embodiment, the number of dislocations (line defects) piercing the c-plane can be easily reduced. Therefore, when a crystal substrate 100 with the c-plane serving as the main face is manufactured using the group 13 nitride crystal 80, the number of line defects extending in the c-axis direction can be reduced, and a high-quality crystal substrate 100 can thereby be obtained.

[7] Preferred Shape of Group 13 Nitride Crystal (Bulk Crystal)

Figure 21:
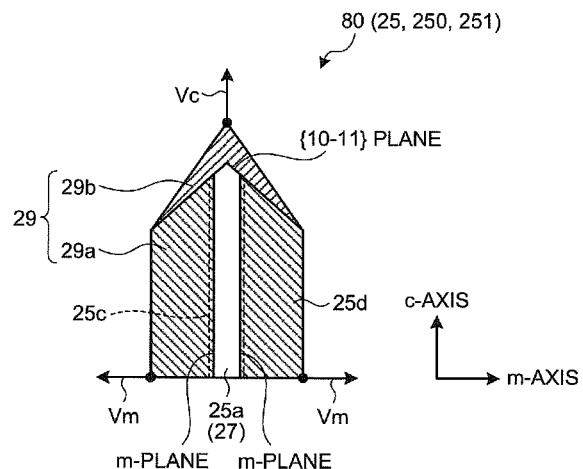
FIG. 21 is a schematic diagram illustrating the process of crystal growth of a group 13 nitride crystal from a seed crystal.
Figure 22:
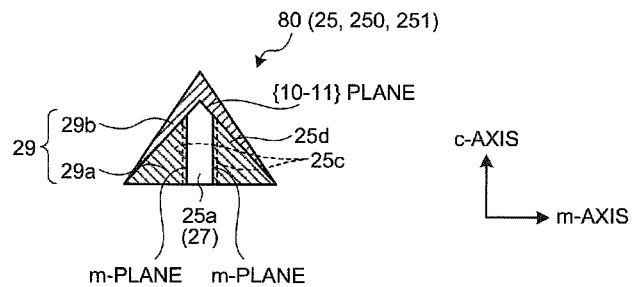
FIG. 22 is a schematic diagram illustrating the process of crystal growth of a group 13 nitride crystal from a seed crystal.
Figure 23:
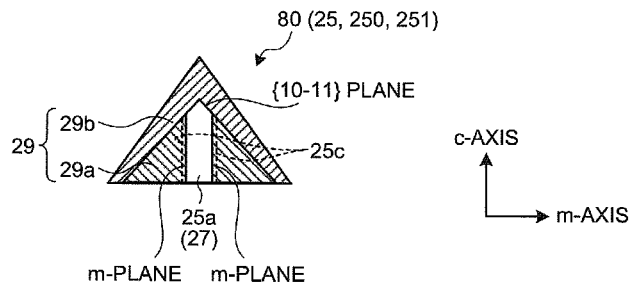
FIG. 23 is a schematic diagram illustrating the process of crystal growth of the group 13 nitride crystal from the seed crystal.

An explanation will now be made on a preferred shape of the group 13 nitride crystal 80 (25, 250, 251). FIGS. 21 to 23 are schematic diagrams illustrating the process of crystal growth of the second region 25c and the third region 25d from the seed crystal (first region 25a) or the seed crystal 27. In the description below, no particular limitation is imposed on the method of crystal growth. FIGS. 21 to 23 are a-plane cross sections of group 13 nitride crystals 80.

As shown in FIG. 21, the group 13 nitride crystal 80 (25, 250, 251) formed by crystal growth from the seed crystal (first region 25a) or the seed crystal 27 is considered to include: a region 29a mainly grown from the m-planes (the outer circumferential surfaces) of the seed crystal (first region 25a) or the seed crystal 27 in the m-axis directions (i.e., the directions in which the area of a hexagonal c-plane cross section increases); and a region 29b mainly grown from the (10-11) planes of the seed crystal (first region 25a) or the seed crystal 27 or the {10-11} planes on the upper surfaces of the region 29a.

In the region 29b, the rate of the formation of the {10-11} planes is considered to be rate determining. This may be because the group 13 nitride crystal grown around the upper portion of the seed crystal (first region 25a) or the seed crystal 27 is often formed into a hexagonal pyramid shape.

FIG. 22 is a schematic diagram illustrating the manner of crystal growth when the c-axial length L of the seed crystal (first region 25a) or the seed crystal 27 is short. When the length L of the seed crystal (first region 25a) or the seed crystal 27 is not sufficiently large, the ratio of the hexagonal pyramid portion to the hexagonal column portion is large. Therefore, the volume ratio of the region 29b formed in the <10-11> directions is larger than the volume ratio of the region 29a formed in the m-axis directions. Accordingly, the group 13 nitride crystal 80 (25, 250, 251) is likely to have a shape shown in FIG. 22. In this case, the region 29b is included in all c-plane cross sections.

FIG. 23 is a schematic diagram illustrating the manner of crystal growth after the crystal growth of the group 13 nitride crystal in FIG. 22 further proceeds. After the outer circumference of the seed crystal (first region 25a) or the seed crystal 27 is surrounded by the region 29b as shown in FIG. 22, no outer circumferential surfaces composed of the m-planes are formed even after the crystal growth further proceeds. It is often observed that the group 13 nitride crystal grows with the {10-11} planes being maintained as the outer circumferential surfaces.

The region 29a is a region crystal-grown from the outer circumferential surfaces (the m-planes) of the seed crystal (first region 25a) or the seed crystal 27. As described in FIG. 16, the number of piercing dislocations in the c-axis direction is considered to be relatively small in the group 13 nitride crystal (the region 29a) grown mainly from the m-planes of the seed crystal (first region 25a) or the seed crystal 27. Therefore, when a crystal substrate 100 (for example, 100a, 100h, 100d, or 100e) having the c-plane serving as the main face is manufactured, it is preferable that the substrate 100 contain a large amount of the region 29a.

When a crystal substrate 100 is manufactured using the lower portion of the group 13 nitride crystal 80 (25, 250, 251) in FIG. 21, i.e., the hexagonal column portion not containing the region 29b, the crystal substrate 100 does not contain the region 29b considered to be grown from planes other than the m-planes.

When a crystal substrate 100 is manufactured using one of the group 13 nitride crystals 80 (25, 250, 251) shown in FIGS. 22 and 23, the crystal substrate 100 includes both the regions 29a and 29b. Generally, different regions grown in different crystal growth directions are known to often have different properties, and a seed crystal and a crystal grown from the seed crystal are known to often have different properties. Therefore, crystal substrates 100 manufactured from the group 13 nitride crystals 80 (25, 250, 251) having the shapes shown in FIGS. 22 and 23 include three regions, i.e., the regions 29a and 29b and the seed crystal (first region 25a) or the seed crystal 27, and the quality of the crystal substrates 100 may deteriorate.

Accordingly, it is preferable that the group 13 nitride crystal 80 (25, 250, 251) in a preferred embodiment have a shape including a hexagonal columnar portion on the lower portion of the crystal. The preferred shape is not limited to the example shown in FIG. 21. In another example, the group 13 nitride crystal 80 may be crystal-grown mainly in the m-axis directions from the seed crystal (first region 25a) or the seed crystal 27 and may have mainly a hexagonal columnar shape.

[8] Preferred Size of Seed Crystal

An explanation will now be made on the shape of the seed crystal (first region 25a) or the seed crystal 27 that is preferable for growth of the group 13 nitride crystal 80 (25, 250, 251) having the preferred shape described in [7] above. The seed crystal (first region 25a) or the seed crystal 27 has a hexagonal crystal structure, and the angles between the c-plane and the <11-23> directions (a-+c-axes) are 58.4°. When the ratio L/d of the c-axial length L of the seed crystal (first region 25a) or the seed crystal 27 (see FIG. 6) to its crystal diameter d in the c-plane cross section is 0.813, the group 13 nitride crystal 25 has a hexagonal pyramid shape.

As described in [7] above, to obtain a high-quality group 13 nitride crystal 80, it is preferable that the group 13 nitride crystal grow mainly from the outer circumferential surfaces (the m-planes) of the seed crystal (first region 25a) or the seed crystal 27. Therefore, in a preferred embodiment, it is preferable that the outer circumferential surfaces of the seed crystal (first region 25a) or the seed crystal 27 contain the m-planes.

Figure 24:
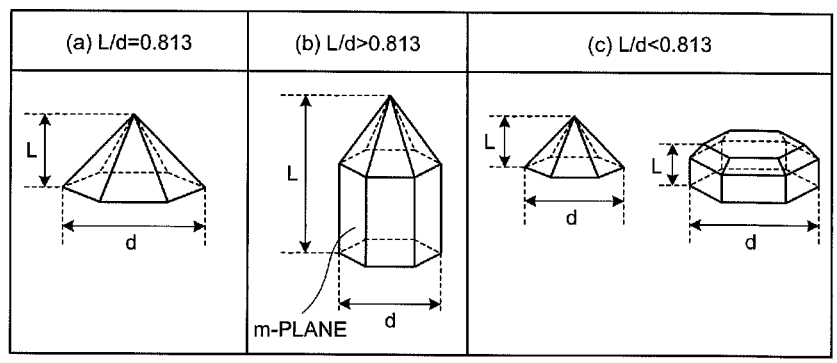
FIG. 24 is a schematic diagram illustrating relations between the shapes of seed crystals and their L/d.

FIG. 24 is a schematic diagram illustrating the relation between the shape of the seed crystal (first region 25a) or the seed crystal 27 and L/d. As shown in FIG. 24, (a) when L/d=0.813, the seed crystal (first region 25a) or the seed crystal 27 has a hexagonal pyramid shape. (b) When L/d>0.813, the upper portion of the seed crystal (first region 25a) or the seed crystal 27 has a hexagonal pyramid shape, and the lower portion has a hexagonal columnar shape. In addition, the outer circumferential surfaces (side surfaces) of the seed crystal (first region 25a) or the seed crystal 27 include the m-planes. (c) When L/d<0.813, the seed crystal (first region 25a) or the seed crystal 27 has a hexagonal pyramid shape containing no m-planes or a shape that does not include a portion including the apex of a hexagonal pyramid, has a c-plane formed on the upper surface of the crystal, and includes a low-height hexagonal columnar portion including the m-planes.

Therefore, in a preferred embodiment, it is preferable that, in the seed crystal (first region 25a) or the seed crystal 27, the ratio L/d of the c-axial length L to the crystal diameter d in the c-plane be larger than 0.813.

The practical size of the crystal substrate 100 is preferably one-half inches (12.7 mm) or 2 inches (5.08 cm). Therefore, An explanation will now be made on the size of the seed crystal (first region 25a) or the seed crystal 27 that is required when a crystal substrate 100 with its c-plane serving as the main face has a size of one-half inches (12.7 mm) or larger, or 2 inches (5.08 cm) or larger.

In the following description, a trial calculation is performed when the thickness of the crystal substrate 100 is 1 mm, which is an example of the minimum thickness required for a practical substrate. However, the minimum thickness required is not limited thereto, and a trial calculation with a different thickness is appropriately performed.

To form a crystal substrate 100 having a diameter of 12.7 mm, i.e., to form a group 13 nitride crystal 25 (250, 251) having a crystal diameter d of 12.7 mm, the group 13 nitride crystal 25 (250, 251) must grow 6.35 mm in the radial directions (the m-axis directions), with the crystal diameter of the seed crystal (first region 25a) or the seed crystal 27 being set to be zero and neglected.

Assuming that, for example, the crystal growth rate Vm in the m-axis directions is twice the crystal growth rate Vc in the c-axis direction. Then, while the crystal grows 6.35 mm in the m-axis directions, it grows about 3.2 mm in the c-axis direction. As described above, L/d>0.813. Therefore, to obtain a crystal diameter d (the diameter of the bottom of the hexagonal pyramid portion) of 12.7 mm, the c-axial length L (the height of the hexagonal pyramid portion) is 11.9 mm. Therefore, it is estimated that the length of the seed crystal 27 must be 11.9−3.2=8.7 mm. Accordingly, the minimum length of the seed crystal 27 required to obtain a group 13 nitride crystal 80 having a hexagonal pyramid shape is 8.7 mm. In addition, it is preferable that a hexagonal columnar portion be formed below the hexagonal pyramid portion. Assuming that the required thickness of the crystal substrate 100 is 1 mm or larger. Then it is estimated that the c-axial length L of the seed crystal 27 must be 9.7 mm.

As described above, in a preferred embodiment, the c-axial length L of the seed crystal (first region 25a) or the seed crystal 27 is preferably 9.7 mm or longer.

In a more preferred embodiment, it is preferable that, in the seed crystal (first region 25a) or the seed crystal 27, the ratio L/d of the c-axial length L to the crystal diameter d in the c-plane be larger than 0.813 and the c-axial length L be 9.7 mm or longer. The L/d is more preferably 7 or larger and still more preferably 30 or larger.

As described above, in the preferred embodiment, a crystal substrate 100 having a c-plane diameter of one-half inches can be manufactured. Since the group 13 nitride crystal 80 (25, 250, 251) grown from the m-planes of the seed crystal (first region 25a) or the seed crystal 27 has high quality as described above, a large and high-quality crystal substrate 100 can be manufactured.

To obtain a crystal substrate 100 having a diameter of 2 inches (5.08 cm), the required c-axial length L of the seed crystal (first region 25a) or the seed crystal 27 is estimated to be 37.4 mm or larger.

Therefore, in a preferred embodiment, the c-axial length L of the seed crystal (first region 25a) or the seed crystal 27 is preferably 37.4 mm or longer. A crystal substrate 100 having a c-plane diameter of 2 inches can thereby be manufactured. Since the group 13 nitride crystal 80 (25, 250, 251) grown from the m-planes of the seed crystal (first region 25a) or the seed crystal 27 has high quality as described above, a high-quality gallium nitride crystal substrate 100 having a large diameter can be manufactured.

EXAMPLES

Examples will be shown below to describe the present invention in more detail. However, the invention is not limited to these Examples. Reference numerals in the following description correspond to those in the configurations of the crystal manufacturing apparatuses 1 and 2 described with reference to FIGS. 10 and 11.

—Production of Seed Crystals—

First, seed crystals used to manufacture group 13 nitride crystals were manufactured by the following manufacturing methods.

<Seed Crystal Production Example 1>

Seed crystals 27 were manufactured using the crystal manufacturing apparatus 1 shown in FIG. 10.

A reactor vessel 12 formed of sintered BN and having an inner diameter of 92 mm was charged with gallium with a nominal purity of 99.99999% and sodium with a nominal purity of 99.95% in a molar ratio of 0.25:0.75.

In a glove box with a high purity Ar gas atmosphere, the reactor vessel 12 was placed in the pressure-resistant vessel 11. The valve 29 was closed to isolate the inside of the reactor vessel 12 from the external atmosphere, and the pressure-resistant vessel 11 was sealed with the vessel 11 being filled with the Ar gas.

Then the pressure-resistant vessel 11 was removed from the glove box and installed in the crystal manufacturing apparatus 1. More specifically, the pressure-resistant vessel 11 was placed in a predetermined position relative to the heater 13 and connected to the gas supply tube 14 for nitrogen gas and argon gas at the valve 29.

Next, the argon gas was purged from the inner vessel 11, and nitrogen gas was introduced from the nitrogen supply tube 17. The pressure of the nitrogen gas was regulated by the pressure regulator 16, and the valve 15 was opened to adjust the nitrogen pressure in the inner vessel 11 to 3.2 MPa. Then the valve 15 was closed, and the pressure regulator 16 was set to 8 MPa. Then the heater 13 was energized to heat the reactor vessel 12 to the crystal growth temperature. In Example 1, the crystal growth temperature was set to 870° C.

At the crystal growth temperature, gallium and sodium in the reactor vessel 12 melted to form a molten mixture 24. The temperature of the molten mixture 24 was the same as the temperature of the reactor vessel 12. In the crystal manufacturing apparatus 1 in this Example, when the temperature was increased to the crystal growth temperature, the gas in the inner vessel 11 was heated, and the total pressure became 8 MPa.

Next, the valve 15 was opened with the nitrogen gas pressure being set to 8 MPa, and the inside of the inner vessel 11 and the inside of the nitrogen supply tube 17 were brought into a pressure equilibrium state.

The reactor vessel 12 was held in this state for 500 hours to grow crystals of gallium nitride. Then the heater 13 was controlled to decrease the temperature of the inner vessel 11 to room temperature (about 20° C.). After the pressure of the gas inside of the inner vessel 11 was reduced, the inner vessel 11 was opened. A large number of gallium nitride crystals 25 were found to be grown in the reactor vessel 12. The grown gallium nitride crystals 25 were colorless and transparent. Their crystal diameter d was about 100 to about 1,500 μm, the length L was about 10 to about 40 mm, and the ratio L/d of the length L to the crystal diameter d was about 20 to about 300. The gallium nitride crystals 25 were grown substantially parallel to the c-axis and had m-planes formed on the side faces.

<Seed Crystal Production Example 2>

Crystals were grown as in Example 1 except that a reactor vessel 12 made of alumina was used, that a plate of sintered BN fittable to the bottom of the reactor vessel 12 was placed therein, that the partial pressure of nitrogen inside of the pressure-resistant vessel 11 at the crystal growth temperature of 870° C. was maintained at 6 MPa (the partial pressure of nitrogen inside of the pressure-resistant vessel 11 at room temperature was 2.8 MPa), and that the time of crystal growth was changed to 300 hours. A large number of colorless and transparent gallium nitride crystals 25 were found to be grown, as in Example 1. The crystal diameter d was about 100 to about 500 μm, the length L was about 10 to about 15 mm, and the ratio L/d of the length L to the crystal diameter d was about 30 to about 500.

The seed crystals 27 manufactured in Seed Crystal Production Examples 1 and 2 were subjected to various measurements. The results of the measurements are shown below.

<Results of Photoluminescence (PL) Measurement>

Photoluminescence (PL) from the seed crystals manufactured in Seed Crystal Production Example 1 was measured at room temperature (25° C.). The photoluminescence was measured using LabRAM HR-80 (fabricated by HORIBA Ltd.). A helium-cadmium (He—Cd) laser with a wavelength of 325 nm was used as an excitation light source. The photoluminescence was measured for each of the first region 25a (the inner region of the seed crystal 27) and the fourth region 25b (the outer region of the seed crystal 27).

FIG. 9 is a diagram showing the results of the measurement of PL emission spectra from the first region 25a and the fourth region 25b. The horizontal axis represents wavelength (nm), and the vertical axis represents emission intensity.

As shown by a solid line in FIG. 9, for the first region 25a in Seed Crystal Production Example 1, broad light-emission with a peak at around 600 nm (a second peak) was observed at 500 nm to 800 nm. However, the intensity of light emission from the near band edge of gallium nitride (364 nm) (a first peak) was very weak.

On the other hand, as shown by a dotted line in FIG. 9, for the fourth region 25b in Seed Crystal Production Example 1, the measured intensity of light emission from the near band edge of gallium nitride (364 nm) (the first peak) was strong, but the intensity of broad light-emission at 500 nm to 800 nm (the second peak) was very weak.

As described above, for the seed crystal 27 manufactured in Seed Crystal Production Example 1, it was found that, in the first region 25a contained on the inner side of the seed crystal 27, the peak intensity of the first peak was smaller than the peak intensity of the second peak. In the fourth region 25b on the outer side of the seed crystal 27, the peak intensity of the first peak was found to be larger than the peak intensity of the second peak.

Figure 25:
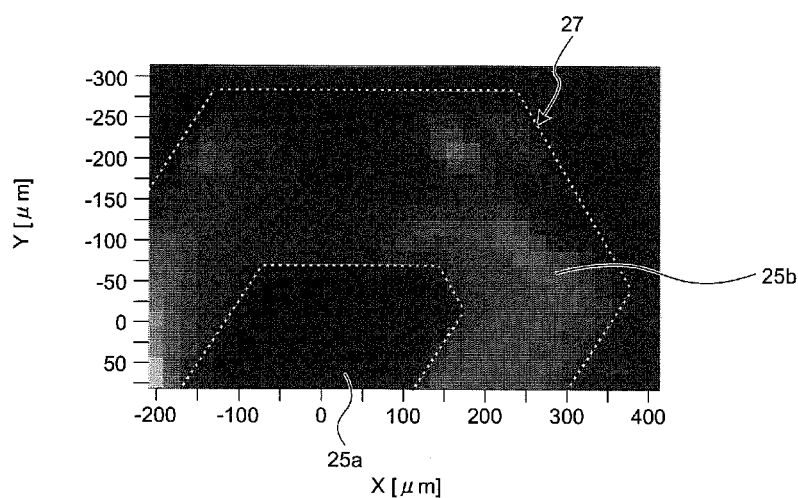
FIG. 25 is a mapping image of the intensity of a photoluminescence spectrum at 360 nm to 370 nm.
Figure 26:
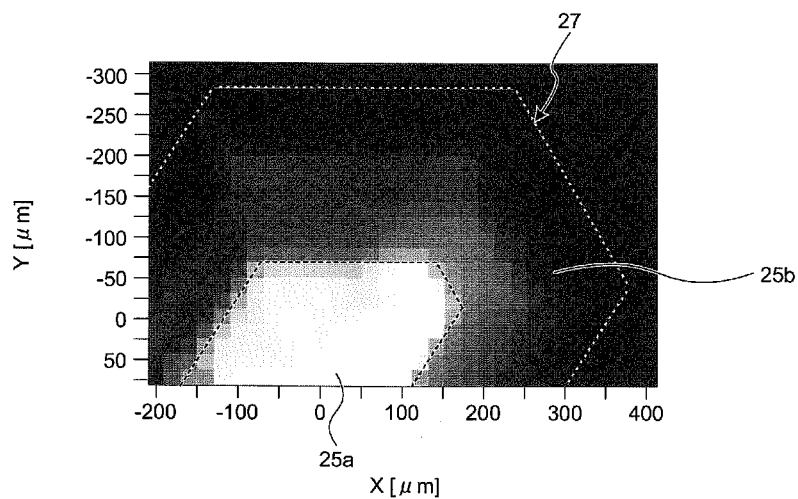
FIG. 26 is a mapping image of the intensity of the photoluminescence spectrum at 500 nm to 800 nm.

Next, with reference to FIGS. 25 and 26, a description will be given of a photoluminescence emission intensity distribution measured on a seed crystal 27 manufactured in Seed Crystal Production Example 1. FIGS. 25 and 26 show examples of the results of photoluminescence measurement on c-plane cross sections of the seed crystals 27 manufactured in Seed Crystal Production Examples 1 and 2. FIGS. 25 and 26 show spectral intensities in different wavelength ranges at the same measurement region in the c-plane cross section.

FIG. 25 is a mapping image of the spectral intensity of photoluminescence at 360 nm to 370 nm. The darker the color, the stronger the spectral intensity at 360 nm to 370 nm.

FIG. 26 is a mapping image of the spectral intensity of photoluminescence at 500 nm to 800 nm. The darker the color, the stronger the spectral intensity at 500 no to 800 nm.

As can be seen from the mapping results in FIGS. 25 and 26, the seed crystal 27 manufactured in Seed Crystal Production Example 1 had the first region 25a on the inner side thereof and the fourth region 25b on the outer side.

The PL from the c-plane cross sections of other seed crystals 27 manufactured in Seed Crystal Production Example 1 was also measured. The results showed that, in some seed crystals 27, the fourth region 25b covered the entire outer circumference of the first region 25a, in a manner similar to that shown in FIG. 5. In the other seed crystals 27, the fourth region 25b was found to cover part of the outer circumference of the first region 25a, in a manner similar to that shown in FIG. 3. As described above, it was found that, in the c-plane cross sections of the seed crystals 27 manufactured in Seed Crystal Production Example 1, the fourth region 25b covered at least part of the outer circumference of the first region 25a.

The PL from the c-plane cross sections of the seed crystals 27 manufactured in Seed Crystal Production Example 2 was also measured in the same manner as described above. The results showed that there were crystals having the first region 25a but having no fourth region found in the c-plane cross sections. More specifically, it was found that there were seed crystals 27 having a c-plane cross section including only a region in which the peak intensity of the first peak was smaller than the peak intensity of the second peak and including no region in which the peak intensity of the first peak was larger than the peak intensity of the second peak.

<Measurement of Boron Density>

The concentration of boron in each of the seed crystals 27 manufactured in Seed Crystal Production Examples 1 and 2 was measured using a secondary ion mass spectrometer (SIMS). The SIMS used was type IMS 7f fabricated by CAMECA. $Cs^+$ ions were used as a primary ion beam.

In this measurement, the boron density was measured at a plurality of points in each of the inner area (i.e., the first region 25a) and the outer area (i.e., the fourth region 25b) of a c-plane cross section of the seed crystal 27.

Although there were some variations in the measurement results at different measurement points, the boron density in the first region 25a was about $5 \times 10^{18}$ $cm^{-3}$ to about $3 \times 10^{19}$ $cm^{-3}$, and the boron density in the fourth region 25b was about $1 \times 10^{16}$ $cm^{-3}$ to about $8 \times 10^{17}$ $cm^{-3}$.

As described above, in the seed crystals 27 manufactured in Seed Crystal Production Examples 1 and 2, it was found that the boron density in the fourth region 25b on the outer side in the c-plane cross section was lower than the boron density in the first region 25a on the inner side.

Next, group 13 nitride crystals 80 were manufactured using the seed crystals 27 manufactured in Seed Crystal Production Examples 1 and 2 by the crystal manufacturing method described in [3] above.

Example A1

In this Example, a crystal was grown from a seed crystal 27 using the crystal manufacturing apparatus 2 shown in FIG. 11 to manufacture a group 13 nitride crystal as an example of the group 13 nitride crystal 251.

The seed crystal 27 manufactured in Seed Crystal Production Example 1 was used. This seed crystal 27 had a width of 1 mm and a length of about 40 mm. In the seed crystal 27 used in this Example, the fourth region 25b covered the entire outer circumference of the first region 25a in at least part of a c-plane cross section, in a manner similar to that shown in FIG. 5. In the c-plane cross section of the seed crystal 27, the thickness t (the thickness in an m-axis direction) of the fourth region 25b was found to be at least 10 μm.

First, the inner vessel 51 was separated from the crystal manufacturing apparatus 2 at the valve 61 and placed in a glove box with an Ar atmosphere. Then the seed crystal 27 was placed in an alumina-made reactor vessel 52 having an inner diameter of 140 mm and a depth of 100 mm. The seed crystal 27 was inserted into a hole having a depth of 4 mm and formed on the bottom of the reactor vessel 52 and held therein.

Next, sodium (Na) was heated and liquefied, and the liquefied sodium was placed in the reactor vessel 52. After the sodium was solidified, gallium was placed in the reactor vessel 52. In this Example, the molar ratio of gallium to sodium was 0.25:0.75.

Then, in the glove box with a high purity Ar gas atmosphere, the reactor vessel 52 was placed in the inner vessel 51. The valve 61 was closed to seal the inner vessel 51 filled with the Ar gas, and the inside of the reactor vessel 52 was isolated from the external atmosphere. Then the inner vessel 51 was removed from the glove box and installed in the crystal manufacturing apparatus 2. More specifically, the inner vessel 51 was placed in a predetermined position relative to the heater 53 and connected to the gas supply tube 54 at the valve 61.

Next, the argon gas was purged from the inner vessel 51, and nitrogen gas was introduced from the nitrogen supply tube 57. The pressure of the nitrogen gas was regulated by the pressure regulator 56, and the valve 55 was opened to adjust the total pressure in the inner vessel 51 to 1.2 MPa. Then the valve 55 was closed, and the pressure regulator 56 was set to 3.2 MPa.

Next, the heater 53 was energized to heat the reactor vessel 52 to crystal growth temperature. The crystal growth temperature was set to 870° C. As in the production in Seed Crystal Production Example 1 above, the valve 55 was opened with the nitrogen gas pressure being set to 3.2 MPa, and the reactor vessel 52 was held in this state for 1,300 hours to grow a gallium nitride crystal.

The crystal diameter of the seed crystal 27 thereby increased in directions perpendicular to the c-axis, whereby a large diameter group 13 nitride crystal 251 (single crystal) was found to grow in the reactor vessel 52. The group 13 nitride crystal 251 obtained by crystal growth was substantially colorless and transparent. The crystal diameter d was 51 mm, and the length L in the c-axis direction including the length of the seed crystal inserted into the reactor vessel was about 54 mm. The group 13 nitride crystal 251 had a shape including a hexagonal pyramid-shaped upper portion and a hexagonal columnar lower portion.

Example A2

In this Example, a crystal was grown in the crystal manufacturing apparatus 2 shown in FIG. 11 under the same conditions as in Example A1 except that the seed crystal 27 manufactured in Seed Crystal Production Example 2 above was used as a seed crystal, so that a group 13 nitride crystal was manufactured as an example of the group 13 nitride crystal 251.

As in the group 13 nitride crystal obtained in Example A1, the group 13 nitride crystal obtained in Example A2 had a hexagonal pyramid-shaped upper portion and a hexagonal columnar lower portion.

—Evaluation—

<Results of Photoluminescence (PL) Measurement>

Photoluminescence (PL) from each of the group 13 nitride crystals manufactured in Examples A1 and A2 above was measured at room temperature under the same conditions as those in the measurement for the seed crystals.

The photoluminescence was measured for each of the first region 25a, the second region 25c, and the third region 25d.

The results showed that, in each of the group 13 nitride crystals manufactured in Examples A1 and A2, the ratio E1/E2 of the peak intensity E1 of light emission from the near band edge (364 nm) (first peak) of gallium nitride to the peak intensity E2 of an emission peak (second peak) on the longer wavelength side of the first peak (500 nm to 800 nm) satisfied the relation in the formula (1) above.

In each of the group 13 nitride crystals manufactured in Examples A1 and A2, the peak intensity E1 of light emission from the near band edge (364 nm) (first peak) of gallium nitride and the peak intensity E2 of the emission peak (second peak) on the longer wavelength side of the first peak (500 nm to 800 nm) satisfied all the relations in the formulae (2) and (3) above.

<Evaluation of State of Formation of Each Region>

For each of the group 13 nitride crystals manufactured in Examples A1 and A2 above, a cathodoluminescence image of a cross section parallel to the c-axis and an a-axis was taken to check the state of the crystal.

Figure 27:
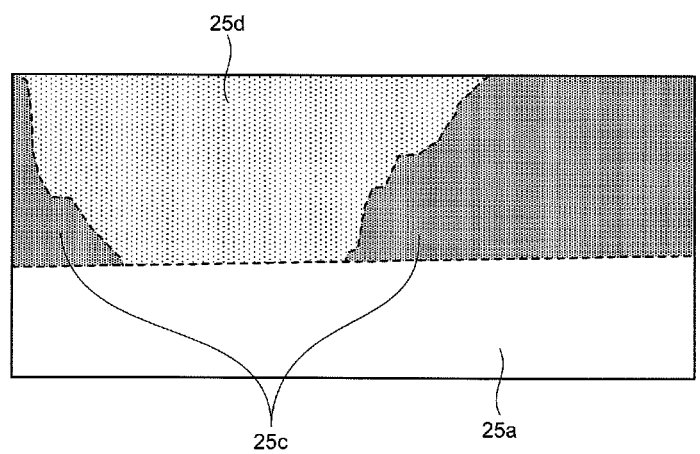
FIG. 27 is a view showing a c-plane cross section of a group 13 nitride crystal.

As shown in FIG. 27, in each of the group 13 nitride crystals manufactured in Examples A1 and A2 above, it was found that the second region 25c was formed on part of the first region 25a and the third region 25d was formed on the first region 25a directly or through the second region 25c. It was also found that the second region 25c had a larger amount of a dark line portion than the first region 25a and the third region 25d and therefore had a large number of defects and dislocations.

<Evaluation of Dislocation Density>

For each of the group 13 nitride crystals manufactured in Examples A1 and A2 above, a cross section parallel to the c-axis and the a-axis was immersed in a molten mixture prepared by mixing molten KOH and molten NaOH at 420° C. (the mass of molten KOH: the mass of molten NaOH=50: 50). The outermost surface of the group 13 nitride crystal was thereby etched to cause etch pits to appear.

Then an image of the microstructure of the etched cross section parallel to the c-axis and a-axis was taken under an electron microscope, and the etch pit density (EPD) was computed from the obtained photograph.

In each of the group 13 nitride crystals manufactured in Examples A1 and A2 above, it was found that the density of dislocations (EPD) in directions intersecting the c-axis in the second region 25c was larger than those in the first region 25a and the third region 25d.

Similarly, for each of the group 13 nitride crystals manufactured in Examples A1 and A2 above, the dislocation density C in the third region 25d and the dislocation density M in the m-planes of the third region 25d were measured as in the above.

The results showed that, in each of the group 13 nitride crystals manufactured in Examples A1 and A2 above, the dislocation density C in the third region 25*d* was lower than the dislocation density M in the m-planes of the third region 25*d*. In addition, the ratio M/C of the dislocation density M to the dislocation density C was larger than 1,000.

Next, group 13 nitride crystal substrates were manufactured using the group 13 nitride crystals manufactured in Examples A1 and A2 above.

Example B1

Production Example of Crystal Substrate Having c-Plane as Main Face

The outer surface of the group 13 nitride crystal manufactured in Example A1 was ground, and the resultant crystal was sliced parallel to the c-plane. Then the surface was polished and subjected to surface treatment to manufacture a crystal substrate 100 (see FIG. 19A) having an outer diameter (ϕ) of 2 inches and a thickness of 400 μm with the c-plane serving as the main face.

The main face (c-plane) of the substrate was immersed in a molten mixture prepared by mixing molten KOH and molten NaOH at 420° C. (the mass of molten KOH: the mass of molten NaOH=50:50). The outermost surface of the GaN crystal substrate was thereby etched to cause etch pits to appear. Then an image of the microstructure of the etched cross section parallel to the c-axis and an a-axis was taken under an electron microscope, and the etch pit density (EPD) was computed from the obtained photograph.

The results showed that the dislocation density in the seed crystal 27 was of the order of $10^6$ cm$^{-2}$ and the dislocation density in the third region 25*d* was of the order of $10^2$ cm$^{-2}$. As compared to a group 13 nitride crystal grown by a conventional crystal manufacturing method using an aluminum nitride needle-shaped crystal as a seed crystal, the obtained group 13 nitride crystal was found to have much smaller dislocation density and higher quality. It was also found by observation under a microscope that the third region 25*d* had no cracks.

The off-angle of the main face (c-plane) of the substrate with respect to the c-axis direction was measured by X-ray analysis and found to be 0.1° or smaller.

Example B2

Production Example of Crystal Substrate Having c-Plane as Main Face

A c-plane substrate was manufactured under the same conditions as in Example B1 except that the group 13 nitride crystal manufactured in Example A2 was used instead of the group 13 nitride crystal manufactured in Example A1. The results obtained were the same as those in Example B1.

According to the present invention, a high quality group 13 nitride crystal and a high quality group 13 nitride crystal substrate can be obtained.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A group 13 nitride crystal having a hexagonal crystal structure and containing at least a nitrogen atom and at least a metal atom selected from a group consisting of B, Al, Ga, In, and Tl, the group 13 nitride crystal comprising:

a first region disposed on an inner side in a cross section intersecting c-axis;

a third region disposed on an outermost side in the cross section and having a crystal property different from that of the first region; and a second region disposed at least partially between the first region and the third region in the cross section, the second region being a transition region of a crystal growth and having a crystal property different from that of the first region and that of the third region, wherein the metal atom includes Ga at least, wherein the crystal property includes a peak intensity ratio E1/E2 where E1 is a peak intensity of a first peak including a band edge emission of gallium nitride and E2 is a peak intensity of a second peak located at 600 nm, in an emission spectrum of the cross section excited by an electron beam or ultraviolet light, and for said first region, second region and third region, said peak intensity ratio E1/E2 satisfies the following formula (1):

$$A1 < A2 < A3 \qquad (1)$$

where A1 represents the peak intensity ratio E1/E2 of the first region, A2 represents the peak intensity ratio E1/E2 of the second region, and A3 represents the peak intensity ratio E1/E2 of the third region.

2. The group 13 nitride crystal according to claim 1, wherein in the cross section, the second region is disposed so as to surround an entire outer periphery of the first region, and the first region and the third region do not contact each other.

3. The group 13 nitride crystal according to claim 1, wherein the peak intensity E2 of the second peak satisfies a formula (2A) and a formula (2B):

$$B1 > B3 \qquad \text{the formula (2A)}$$

$$B2 > B3 \qquad \text{the formula (2B)}$$

in the formula (2A), B1 represents the peak intensity E2 of the second peak of the first region, in the formula (2B), B2 represents the peak intensity E2 of the second peak of the second region, and in the formula (2A) and the formula (2B), B3 represents the peak intensity E2 of the second peak of the third region.

4. The group 13 nitride crystal according to claim 1, wherein the peak intensity E1 of the first peak satisfies a formula (3A) and a formula (3B):

$$C1 < C3 \qquad \text{the formula (3A)}$$

$$C2 < C3 \qquad \text{the formula (3B)}$$

in the formula (3A), C1 represents the peak intensity E1 of the first peak of the first region, in the formula (3B), C2 represents the peak intensity E1 of the first peak of the second region, and in the formula (3A) and the formula (3B), C3 represents the peak intensity E1 of the first peak of the third region.

5. The group 13 nitride crystal according to claim 1, wherein a dislocation density in the second region about one or more dislocations extending in a plane intersecting the c-axis is higher than a dislocation density in the first region about one or more dislocations extending in the plane intersecting the c-axis, and the dislocation density in the second region about one or more dislocations extending in the plane intersecting the c-axis is higher than a dislocation density in the third region about one or more dislocations extending in the plane intersecting the c-axis.

6. The group 13 nitride crystal according to claim 1, further comprising a fourth region disposed on an outer side of the first region and an inner side of the second region and the third region in the cross section, wherein
- in the first region, the peak intensity E1 of the first peak is smaller than the peak intensity E2 of the second peak,
- in the fourth region, the peak intensity E1 of the first peak is greater than the peak intensity E2 of the second peak,
- and the second peak is located in a longer wavelength area than the first peak in the emission spectrum of the cross section excited by the electron beam or the ultraviolet light.

7. The group 13 nitride crystal according to claim 1, wherein
- a dislocation density C of c-plane in the third region is lower than a dislocation density M of m-plane in the third region.

8. A group 13 nitride crystal substrate comprising
at least a part of a group 13 nitride crystal having a hexagonal crystal structure and containing at least a nitrogen atom and at least a metal atom selected from a group consisting of B, Al, Ga, In, and Tl, wherein the group 13 nitride crystal includes:
- a first region disposed on an inner side in a cross section intersecting c-axis;
- a third region disposed on an outermost side in the cross section and having a crystal property different from that of the first region; and
- a second region disposed at least partially between the first region and the third region in the cross section, the second region being a transition region of a crystal growth and having a crystal property different from that of the first region and that of the third region,
wherein the metal atom includes Ga at least,
wherein the crystal property includes a peak intensity ratio E1/E2 where E1 is a peak intensity of a first peak including a band edge emission of gallium nitride and E2 is a peak intensity of a second peak located at 600 nm, in an emission spectrum of the cross section excited by an electron beam or ultraviolet light, and for said first region, second region and third region, said peak intensity ratio E1/E2 satisfies the following formula (1):

$$A1 < A2 < A3 \quad (1)$$

where A1 represents the peak intensity ratio E1/E2 of the first region, A2 represents the peak intensity ratio E1/E2 of the second region, and A3 represents the peak intensity ratio E1/E2 of the third region.

9. The group 13 nitride crystal substrate according to claim 8, wherein
a main face is c-plane, and
an off angle relative to the c-axis is less than 0.1 degrees.

10. The group 13 nitride crystal according to claim 1, wherein the first region contains boron of $4 \times 10^{18}/cm^3$ or more.

* * * * *